US012696545B2

(12) United States Patent
Chang et al.

(10) Patent No.: US 12,696,545 B2
(45) Date of Patent: Jul. 28, 2026

(54) ACTIVE MATRIX (AM) DRIVEN DISPLAY DEVICE USING A SEMICONDUCTOR LIGHT EMITTING DEVICE

(71) Applicant: LG ELECTRONICS INC., Seoul (KR)

(72) Inventors: Jaewon Chang, Seoul (KR); Soohyun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 500 days.

(21) Appl. No.: 18/252,335

(22) PCT Filed: Nov. 10, 2020

(86) PCT No.: PCT/KR2020/015678
§ 371 (c)(1),
(2) Date: May 9, 2023

(87) PCT Pub. No.: WO2022/102794
PCT Pub. Date: May 19, 2022

(65) Prior Publication Data
US 2025/0081607 A1      Mar. 6, 2025

(51) Int. Cl.
| | |
|---|---|
| *H10D 86/60* | (2025.01) |
| *G09G 3/32* | (2016.01) |
| *H10D 86/40* | (2025.01) |
| *H10H 20/857* | (2025.01) |
| *H10W 90/00* | (2026.01) |

(52) U.S. Cl.
CPC ............... *H10D 86/60* (2025.01); *G09G 3/32* (2013.01); *H10D 86/441* (2025.01);
(Continued)

(58) Field of Classification Search
CPC .... H10D 86/60; H10D 86/441; H10D 86/481; H10D 86/00; G09G 3/32;
(Continued)

(56) References Cited

U.S. PATENT DOCUMENTS

| | | | | |
|---|---|---|---|---|
| 9,627,462 | B2 * | 4/2017 | Kwon | H10D 86/481 |
| 10,084,030 | B2 * | 9/2018 | Oh | H10D 86/60 |

(Continued)

FOREIGN PATENT DOCUMENTS

| | | |
|---|---|---|
| KR | 1020080002623 | 1/2008 |
| KR | 100960908 | 6/2010 |

(Continued)

OTHER PUBLICATIONS

Korean Intellectual Property Office Application No. 10-2023-7015602, Office Action dated Oct. 7, 2024, 7 pages.

(Continued)

*Primary Examiner* — Tan N Tran
(74) *Attorney, Agent, or Firm* — LEE, HONG, DEGERMAN, KANG & WAIMEY

(57) ABSTRACT

The purpose of the present invention is to improve, in connection with a display device using a semiconductor light-emitting element configured for active matrix (AM) driving, flicker caused by leakage from a switch TFT by increasing the capacitance value of a capacitance. To this end, the display device using a semiconductor light-emitting element may comprise: a driving TFT for driving the semiconductor light-emitting element; a switch TFT for receiving a scan signal to be turned on or off and transmitting a data signal to the driving TFT; a first capacitance formed between a first metal layer connected to a gate terminal of the driving TFT and a second metal layer connected to a source terminal or a drain terminal of the driving TFT; and a second capacitance formed between an active layer of the driving TFT and the second metal layer.

18 Claims, 21 Drawing Sheets

(52) U.S. Cl.
CPC ........ *H10D 86/481* (2025.01); *H10H 20/857*
(2025.01); *H10W 90/00* (2026.01); *G09G*
*2320/0247* (2013.01)

(58) Field of Classification Search
CPC .......... G09G 2320/0247; G09G 3/3233; H01L
25/167; H01L 25/0753; H01L 25/16;
H10H 20/857; H10H 29/39; H10W 90/00
See application file for complete search history.

(56) References Cited

U.S. PATENT DOCUMENTS

| | | | | |
|---|---|---|---|---|
| 10,177,209 | B2 * | 1/2019 | Her | G09G 3/3233 |
| 11,251,253 | B2 * | 2/2022 | Bai | H10K 59/1216 |
| 2024/0055566 | A1 * | 2/2024 | Tae | H01L 25/167 |

FOREIGN PATENT DOCUMENTS

| | | |
|---|---|---|
| KR | 1020100077003 | 7/2010 |
| KR | 1020110075517 | 7/2011 |
| KR | 101054327 | 8/2011 |
| KR | 1020130037580 | 4/2013 |
| KR | 1020130037587 | 4/2013 |
| KR | 1020160002337 | 1/2016 |
| KR | 1020160042376 | 4/2016 |
| KR | 1020180071471 | 6/2018 |
| KR | 1020180076828 | 7/2018 |
| KR | 1020190057183 | 5/2019 |

OTHER PUBLICATIONS

Korean Intellectual Property Office Application No. 10-2023-7015602, Notice of Allowance dated Jun. 29, 2025, 3 pages.

* cited by examiner

ACTIVE MATRIX (AM) DRIVEN DISPLAY DEVICE USING A SEMICONDUCTOR LIGHT EMITTING DEVICE

CROSS-REFERENCE TO RELATED APPLICATION(S)

This application is the National Stage filing under 35 U.S.C. 371 of International Application No. PCT/KR2020/015678, filed on Nov. 10, 2020, the contents of which are all hereby incorporated by reference herein in its entirety.

TECHNICAL FIELD

The present disclosure relates to a display device using a semiconductor light emitting device. Specifically, the present disclosure may be applied to a technology field for reducing image quality defects caused by leakage of a switch TFT in active matrix (AM) driving.

BACKGROUND

A light emitting diode (LED) is a well-known semiconductor light emitting device that converts current into light. Starting with commercialization of a red LED using a GaAsP compound semiconductor in 1962, the LED has been used as a light source for displaying an image of an electronic device including an information communication device along with a GaP:N-based green LED. The semiconductor light emitting device has various advantages over a filament-based light emitting device, such as a long life, low power consumption, excellent initial driving characteristics, and high vibration resistance.

The semiconductor light emitting device has recently been miniaturized and is widely applied to a flexible display and a stretchable display. The semiconductor light emitting devices may be classified into a mini LED and a micro LED in size. For convenience, the mini LED may have a size of hundreds of micrometers and the micro LED may have a size of several to several tens of micrometers.

As the semiconductor light emitting device is miniaturized, it is possible to implement a display with a high resolution. Active matrix (AM) driving is more advantageous than passive matrix (PM) driving for the display with the high resolution. In the case of AM driving, there is a problem in that an image quality defect (flicker) phenomenon occurs due to a signal leakage from a switch thin film transistor (TFT). To reduce such problem, there is a method for reducing leakage characteristics of the switch TFT or increasing a capacitance of a capacitor. There is a problem in reducing the leakage characteristics of the switch TFT that a range of improvement is narrow due to characteristics of the device itself. There is a disadvantage that it is difficult to control the increase in the capacitance of the capacitor because of a fixed resolution (a pixel size).

SUMMARY

Technical Problem

One embodiment of the present disclosure is to provide a display device that is active matrix (AM) driven.

One embodiment of the present disclosure is to reduce image quality defects (flicker) resulted from a signal leakage occurring in a switch TFT in an AM driven display device.

One embodiment of the present disclosure is to easily expand a capacitance of a capacitor at a predetermined resolution (pixel size).

Furthermore, another purpose of one embodiment of the present disclosure is to solve various problems not mentioned herein. A person skilled in the art may understand this via entire contents of the present document and drawings.

Technical Solutions

One embodiment of the present disclosure to achieve the above purpose provides an active matrix (AM) driven display device using a semiconductor light emitting device including a driving TFT for driving the semiconductor light emitting device, a switch TFT for receiving a scan signal so as to be turned on or off, and transmitting a data signal to a gate terminal of the driving TFT, a first capacitor formed between a first metal pattern connected to the gate terminal of the driving TFT and a second metal pattern connected to a source terminal or a drain terminal of the driving TFT, and a second capacitor formed between an active layer of the driving TFT and the second metal pattern.

In addition, according to one embodiment, the first capacitor may be formed as the first metal pattern and the second metal pattern, extending in an area where the driving TFT is disposed, overlap each other with an insulator interposed therebetween.

In addition, according to one embodiment, the second capacitor may be formed as the active layer and the second metal pattern, extending in an area where the driving TFT is disposed, overlap each other with an insulator interposed therebetween.

In addition, according to one embodiment, the second metal pattern may include an upper second metal pattern disposed on the first metal pattern, and a lower second metal pattern connected to the upper second metal pattern with a via hole and disposed on a layer below a layer of the upper second metal pattern.

In addition, according to one embodiment, the lower second metal pattern may be disposed on the same layer as the first metal pattern.

In addition, according to one embodiment, the first capacitor and the first capacitor may be formed in a first area and a second area not overlapping each other, respectively.

In addition, according to one embodiment, the first capacitor and the second capacitor may be connected in parallel with each other on a driving circuit connected to the semiconductor light emitting device.

In addition, according to one embodiment, the second metal pattern may be connected to a power supply for providing a first fixed voltage and a second fixed voltage to be applied with the first fixed voltage.

In addition, according to one embodiment, the first fixed voltage and the second fixed voltage may be VSS and VDD or the VDD and the VSS, respectively.

In addition, according to one embodiment, the semiconductor light emitting device may be connected to the drain terminal of the driving TFT and applied with the second fixed voltage when the second metal pattern is connected to the source terminal of the driving TFT, and the semiconductor light emitting device may be connected to the source terminal of the driving TFT and applied with the second fixed voltage when the second metal pattern is connected to the drain terminal of the driving TFT.

In addition, according to one embodiment, the semiconductor light emitting device may include a plurality of semiconductor light emitting devices connected in series to each other via a third metal pattern.

In addition, according to one embodiment, the third metal pattern may be disposed so as not to overlap an area where the first capacitor is disposed.

In addition, according to one embodiment, the third metal pattern may be disposed so as not to overlap an area where the second capacitor is disposed.

In addition, according to one embodiment, in the switch TFT, the scan signal may be input to a gate terminal, the data signal may be input to one of a source terminal and a drain terminal, and the other of the source terminal and the drain terminal may be connected to the gate terminal of the driving TFT.

In addition, according to one embodiment, the display may further include an output area in which a plurality of unit light emitting areas are arranged, and each of the unit light emitting areas may include the semiconductor light emitting device, the switch TFT, the driving TFT, the first capacitor, and the second capacitor.

Advantageous Effects

The display device using the semiconductor light emitting device according to the embodiment may be active matrix (AM) driven to output the image or may be locally dimmed by applying a backlight to a liquid crystal panel.

The display device using the semiconductor light emitting device according to the embodiment may be AM driven and may reduce the image quality defects (the flicker) caused by the signal leakage occurring in the switch TFT.

The display device using the semiconductor light emitting device according to the embodiment may easily expand the capacitance of the capacitor at the predetermined resolution (the pixel size).

Furthermore, according to another embodiment of the present disclosure, there are additional technical effects not mentioned herein. A person skilled in the art may understand this via the entire contents of the present document and drawings.

BRIEF DESCRIPTION OF THE DRAWINGS

FIG. 2 is a partially enlarged diagram showing a part A shown in FIG. 1;

FIGS. 3A and 3B are cross-sectional diagrams taken along the cutting lines B-B and C-C in FIG. 2;

FIGS. 5A to 5C are conceptual diagrams illustrating various examples of color implementation with respect to a flip-chip type semiconductor light emitting device;

FIG. 8 is a cross-sectional diagram taken along a cutting line D-D shown in FIG. 8;

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting device mentioned in this specification is a concept including an LED, a micro LED, and the like.

Figure 1:
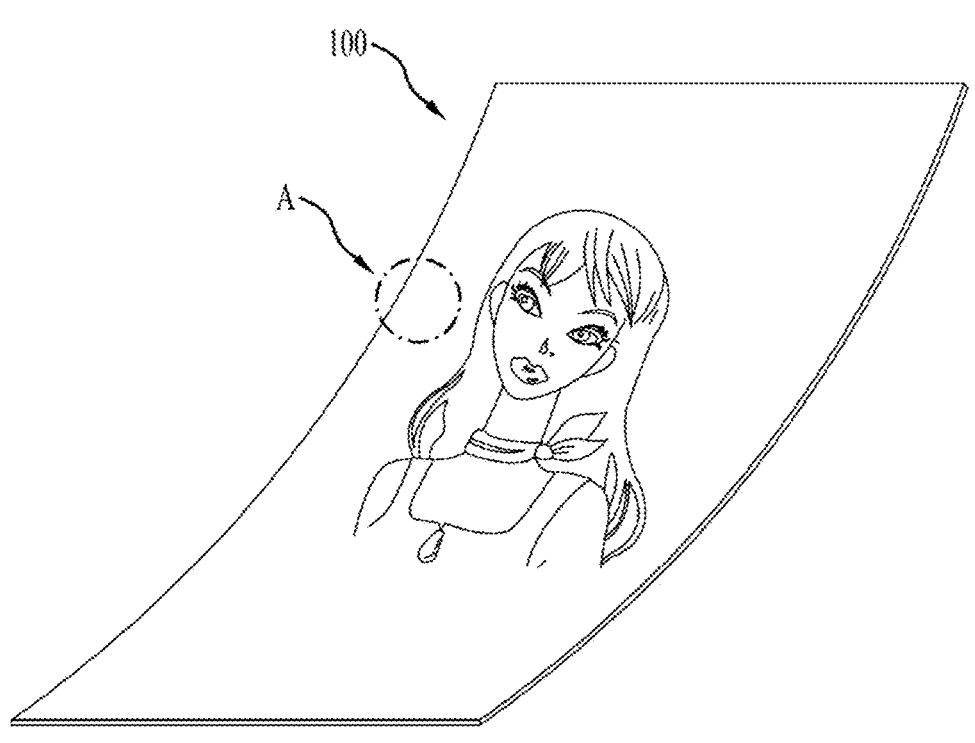
FIG. 1 is a conceptual diagram illustrating an embodiment of a display device using a semiconductor light emitting device according to the present disclosure.

FIG. 1 is a conceptual view illustrating an embodiment of a display device using a semiconductor light emitting device according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting device. In the present disclosure, a light emitting diode (LED) is exemplified as a type of the semiconductor light emitting device configured to convert electric current into light. The LED may be formed in a small size, and may thus serve as a unit pixel even in the second state.

Hereinafter, a flexible display implemented using the LED will be described in more detail with reference to the drawings.

Figure 2:
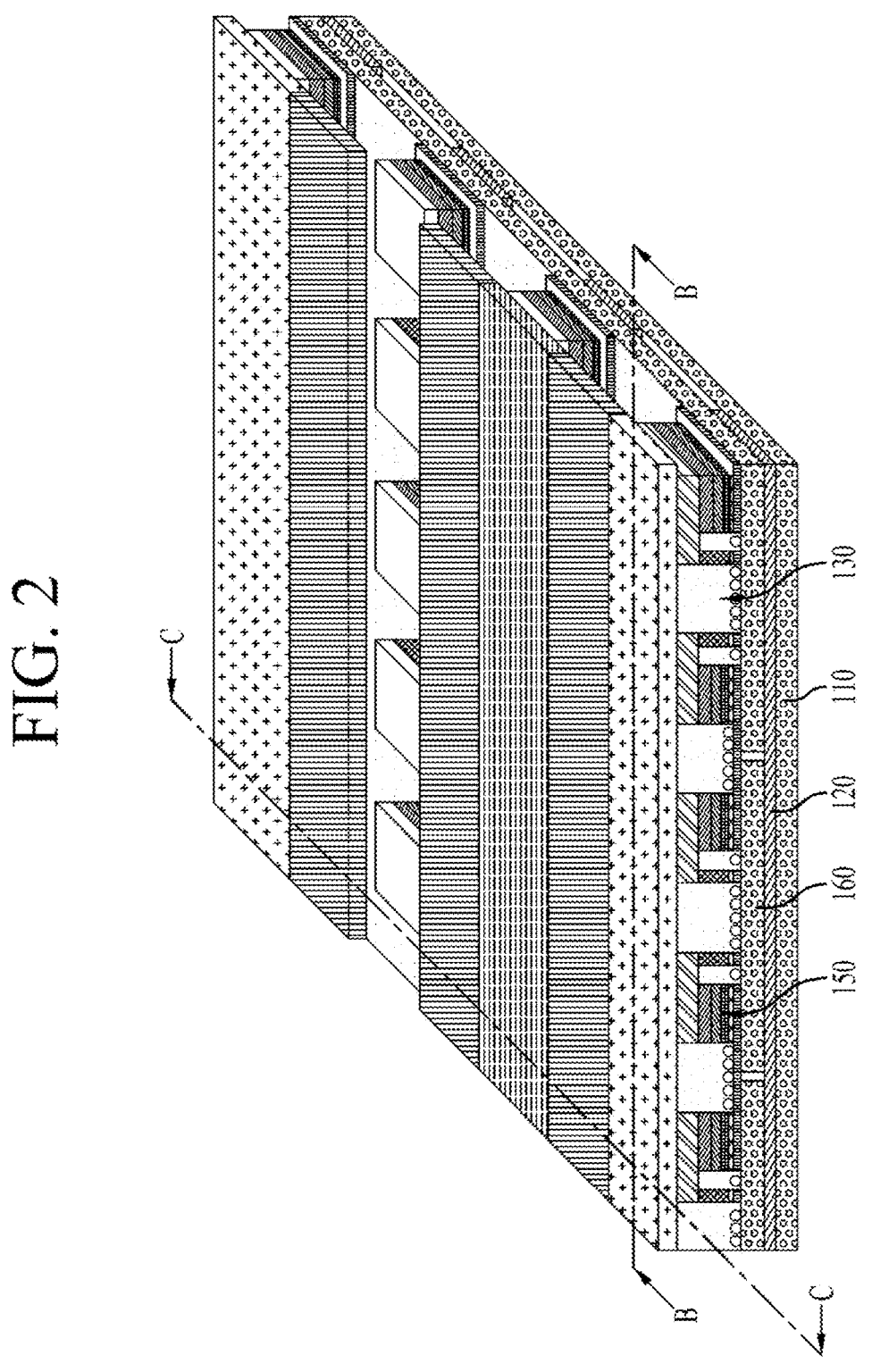

FIG. 2 is a partially enlarged view showing part A of FIG. 1.

Figures 3A, 3B:
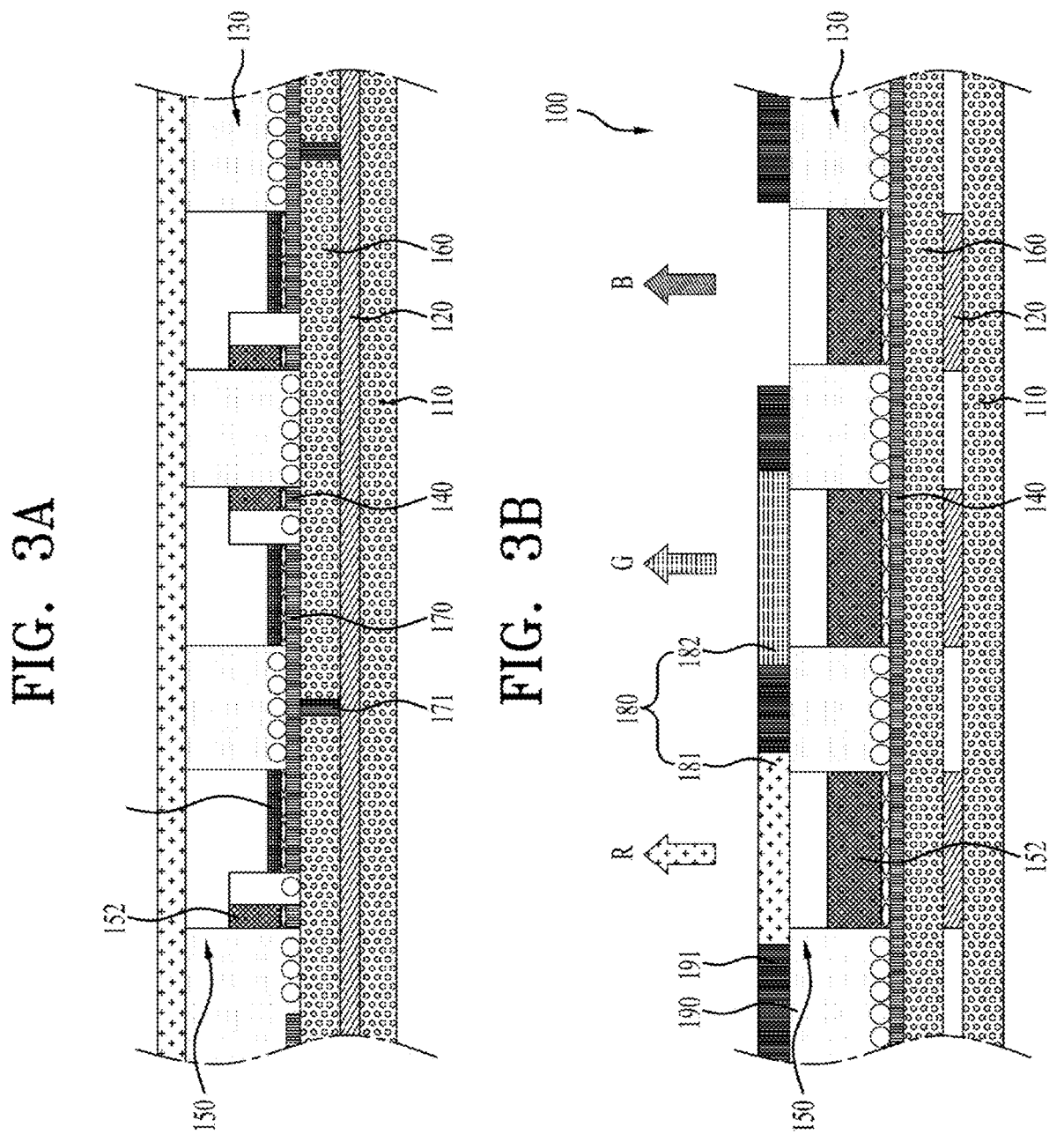

FIGS. 3A and 3B are cross-sectional views taken along lines B-B and C-C in FIG. 2.

Figure 4:
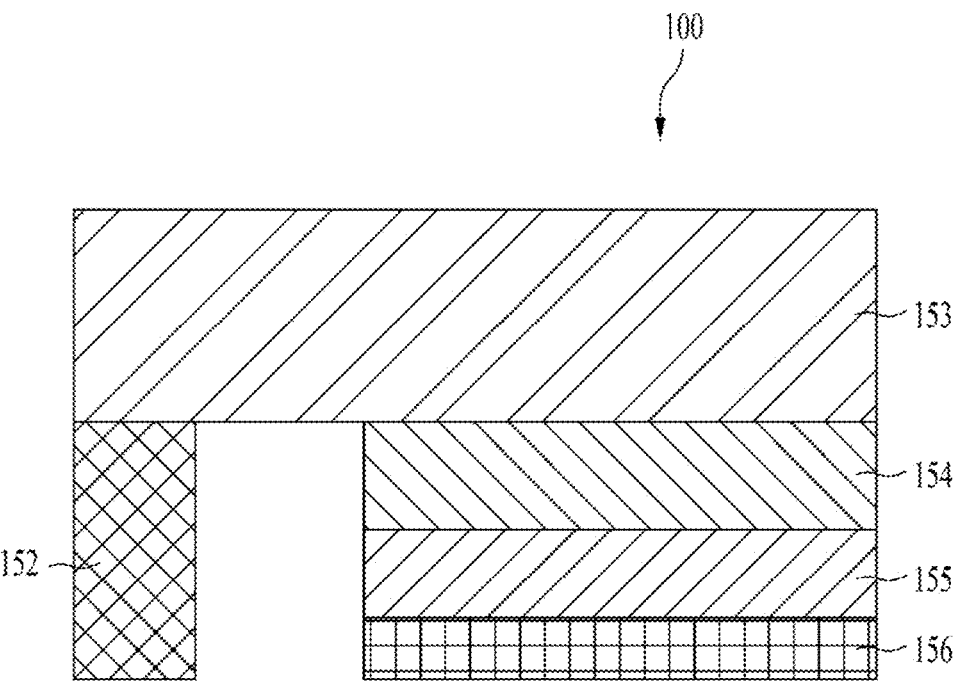
FIG. 4 is a conceptual diagram illustrating the flip-chip type semiconductor light emitting device of FIG. 3.

FIG. 4 is a conceptual view illustrating the flip-chip type semiconductor light emitting device of FIG. 3.

Figures 5A, 5B:
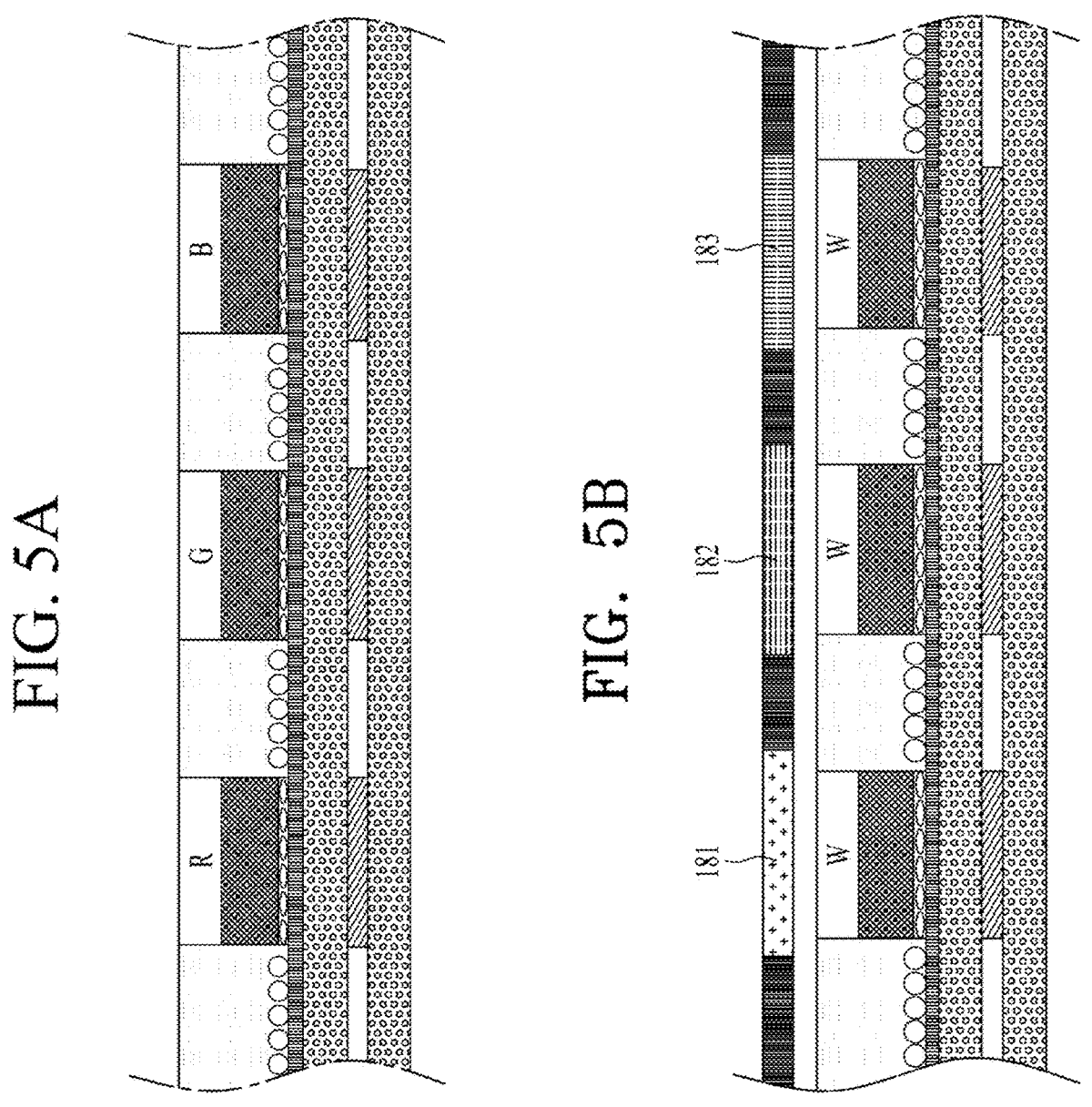
Figure 5C:
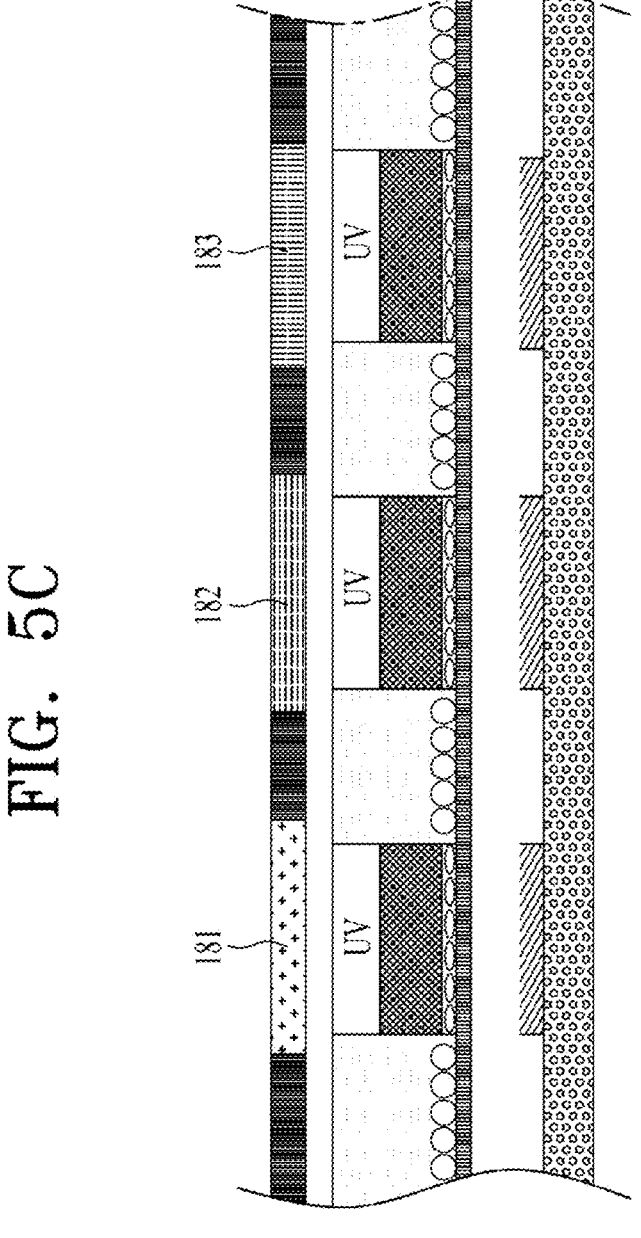

FIGS. 5A to 5C are conceptual views illustrating various examples of implementation of colors in relation to a flip-chip type semiconductor light emitting device.

As shown in FIGS. 2, 3A and 3B, the display device 100 using a passive matrix (PM) type semiconductor light emitting device is exemplified as the display device 100 using a semiconductor light emitting device. However, the examples described below are also applicable to an active matrix (AM) type semiconductor light emitting device.

The display device 100 shown in FIG. 1 may include a substrate 110, a first electrode 120, a conductive adhesive layer 130, a second electrode 140, and at least one semiconductor light emitting device 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting device 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting device 150 is connected thereto in a flip-chip form by applying heat and pressure. Thereby, the semiconductor light emitting device 150 is electrically connected to the first electrode 120 and the second electrode 140.

Referring to FIG. 4, the semiconductor light emitting device may be a flip chip-type light emitting device.

For example, the semiconductor light emitting device may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting devices 150. For example, p-type electrodes of semiconductor light emitting devices on left and right sides of an auxiliary electrode may be electrically connected to one auxiliary electrode.

More specifically, the semiconductor light emitting device 150 may be press-fitted into the conductive adhesive layer 130 by heat and pressure. Thereby, only the portions of the semiconductor light emitting device 150 between the p-type electrode 156 and the auxiliary electrode 170 and between the n-type electrode 152 and the second electrode 140 may exhibit conductivity, and the other portions of the semiconductor light emitting device 150 do not exhibit conductivity as they are not press-fitted. In this way, the conductive adhesive layer 130 interconnects and electrically connects the semiconductor light emitting device 150 and the auxiliary electrode 170 and interconnects and electrically connects the semiconductor light emitting device 150 and the second electrode 140.

The plurality of semiconductor light emitting devices 150 may constitute a light emitting device array, and a phosphor conversion layer 180 may be formed on the light emitting device array.

The light emitting device array may include a plurality of semiconductor light emitting devices having different luminance values. Each semiconductor light emitting device 150 may constitute a unit pixel and may be electrically connected to the first electrode 120. For example, a plurality of first electrodes 120 may be provided, and the semiconductor light emitting devices may be arranged in, for example, several columns. The semiconductor light emitting devices in each column may be electrically connected to any one of the plurality of first electrodes.

In addition, since the semiconductor light emitting devices are connected in a flip-chip form, semiconductor light emitting devices grown on a transparent dielectric substrate may be used. The semiconductor light emitting devices may be, for example, nitride semiconductor light emitting devices. Since the semiconductor light emitting device 150 has excellent luminance, it may constitute an individual unit pixel even when it has a small size.

As shown in FIG. 3, a partition wall 190 may be formed between the semiconductor light emitting devices 150. In this case, the partition wall 190 may serve to separate individual unit pixels from each other, and may be integrated with the conductive adhesive layer 130. For example, by inserting the semiconductor light emitting device 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting device 150. For example, the semiconductor light emitting device 150 may be a blue semiconductor light emitting device that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting device at a position of a unit pixel of red color, and the green phosphor 182 capable of converting blue light into green (G) light may be laminated on the blue semiconductor light emitting device at a position of a unit pixel of green color. Only the blue semiconductor light emitting device may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting device 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting device may be implemented as a high-power light emitting device emitting light of various colors including blue by using gallium nitride (GaN) as a main material and adding indium (In) and/or aluminum (Al).

In this case, each semiconductor light emitting device may be a red, green, or blue semiconductor light emitting device to form a unit pixel (sub-pixel). For example, red, green, and blue semiconductor light emitting devices R, G, and B may be alternately disposed, and unit pixels of red, green, and blue may constitute one pixel by the red, green and blue semiconductor light emitting devices. Thereby, a full-color display may be implemented.

Referring to FIG. 5B, the semiconductor light emitting device 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting device. In an embodiment, UV may be used as an excitation source of the upper phosphor in the semiconductor light emitting device.

Referring back to this example, the semiconductor light emitting device is positioned on the conductive adhesive layer to constitute a unit pixel in the display device. Since the semiconductor light emitting device has excellent luminance, individual unit pixels may be configured despite even when the semiconductor light emitting device has a small size.

Regarding the size of such an individual semiconductor light emitting device, the length of each side of the device may be, for example, 80 μm or less, and the device may have a rectangular or square shape. When the semiconductor light emitting device has a rectangular shape, the size thereof may be less than or equal to 20 μm×80 μm.

In addition, even when a square semiconductor light emitting device having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting device becomes sufficiently long relatively.

Thus, in this case, it is able to implement a flexible display device having high image quality over HD image quality.

The above-described display device using the semiconductor light emitting device may be prepared by a new fabricating method. Such a fabricating method will be described with reference to FIG. 6 as follows.

Figure 6:
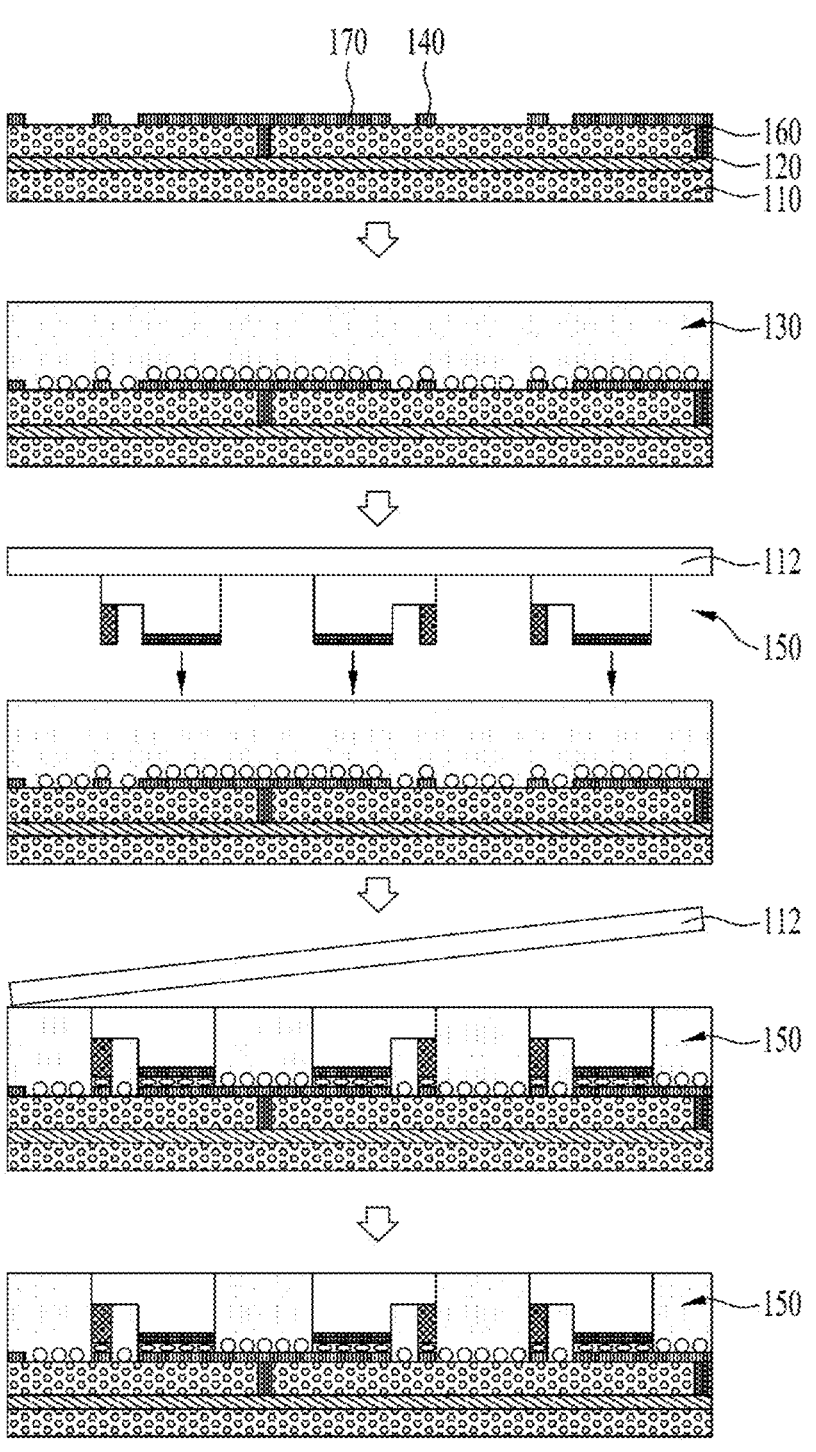
FIG. 6 shows cross-sectional views of a method of fabricating a display device using a semiconductor light emitting device according to the present disclosure.

FIG. 6 shows cross-sectional views of a method of fabricating a display device using a semiconductor light emitting device according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting devices 150 configuring individual pixels are located to correspond to locations of the auxiliary electrode 170 and the second electrodes 140, is disposed in a manner that the semiconductor light emitting device 150 confronts the auxiliary electrode 170 and the second electrode 140.

In this regard, the temporary 112 substrate 112 is a growing substrate for growing the semiconductor light emitting device 150 and may include a sapphire or silicon substrate.

The semiconductor light emitting device is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting device 150, the auxiliary electrode 170 and the second electrode 140 has conductivity, via which the electrodes and the semiconductor light emitting device 150 may be connected electrically. In this case, the semiconductor light emitting device 150 is inserted into the anisotropic conductive film, by which a partition may be formed between the semiconductor light emitting devices 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting devices 150 exposed externally. If necessary, the wiring substrate 110 to which the semiconductor light emitting devices 150 are coupled may be coated with silicon oxide (SiOx) or the like to form a transparent insulating layer (not shown).

In addition, a step of forming a phosphor layer on one side of the semiconductor light emitting device 150 may be further included. For example, the semiconductor light emitting device 150 may include a blue semiconductor light emitting device emitting Blue (B) light, and a red or green phosphor for converting the blue (B) light into a color of a unit pixel may form a layer on one side of the blue semiconductor light emitting device.

The above-described fabricating method or structure of the display device using the semiconductor light emitting device may be modified into various forms. For example, the above-described display device may employ a vertical semiconductor light emitting device.

Furthermore, a modification or embodiment described in the following may use the same or similar reference numbers for the same or similar configurations of the former example and the former description may apply thereto.

Figure 7:
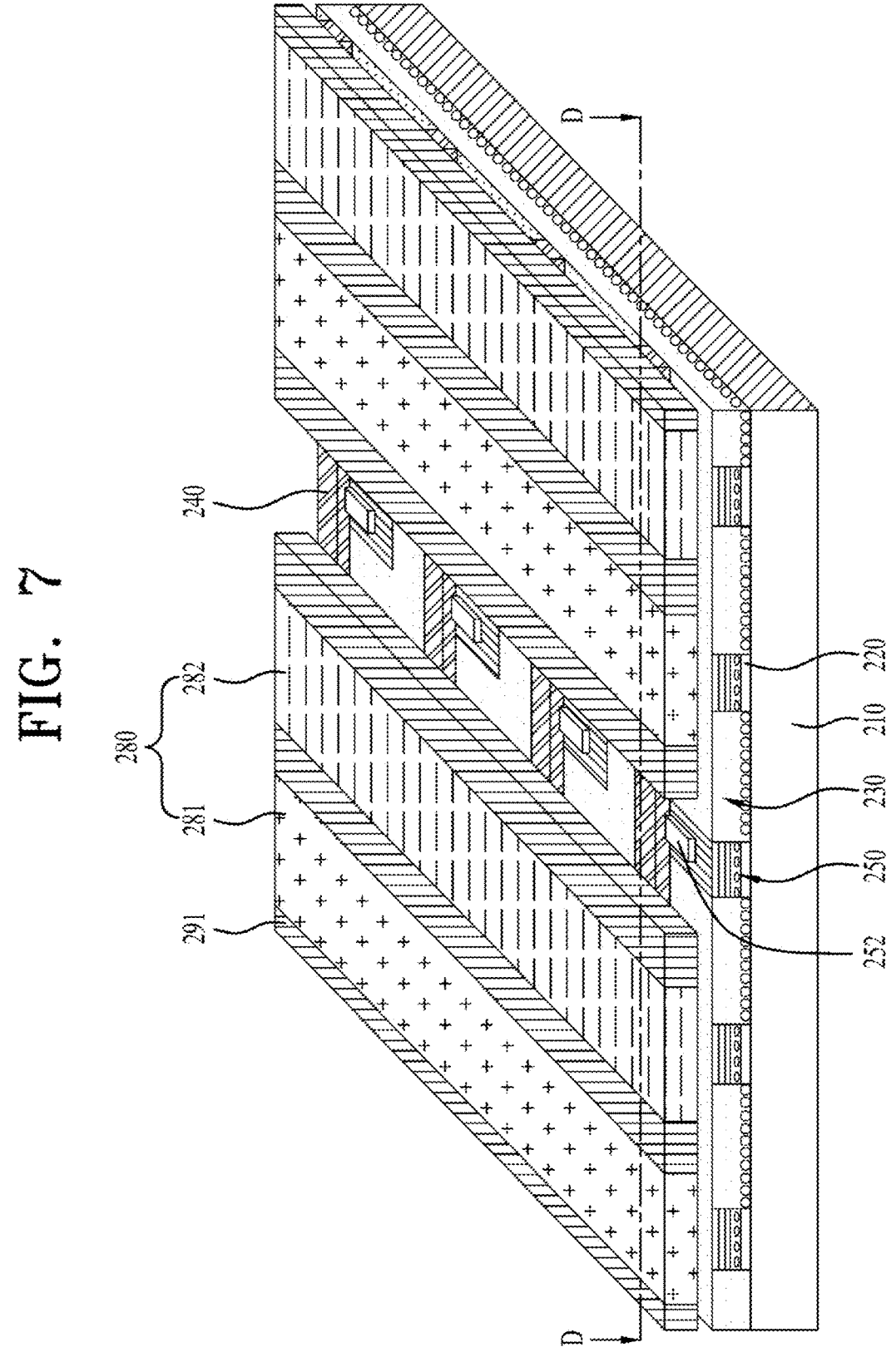
FIG. 7 is a perspective diagram of a display device using a semiconductor light emitting device according to another embodiment of the present disclosure.
Figure 8:
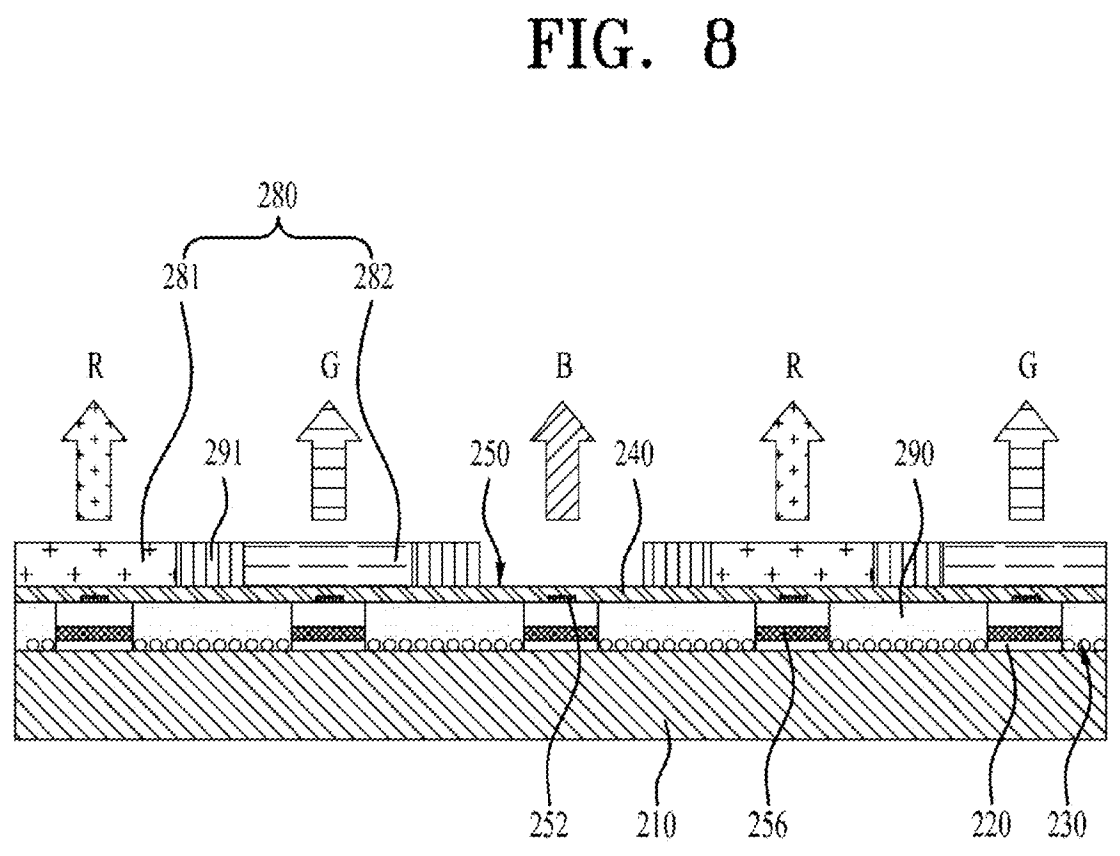
Figure 9:
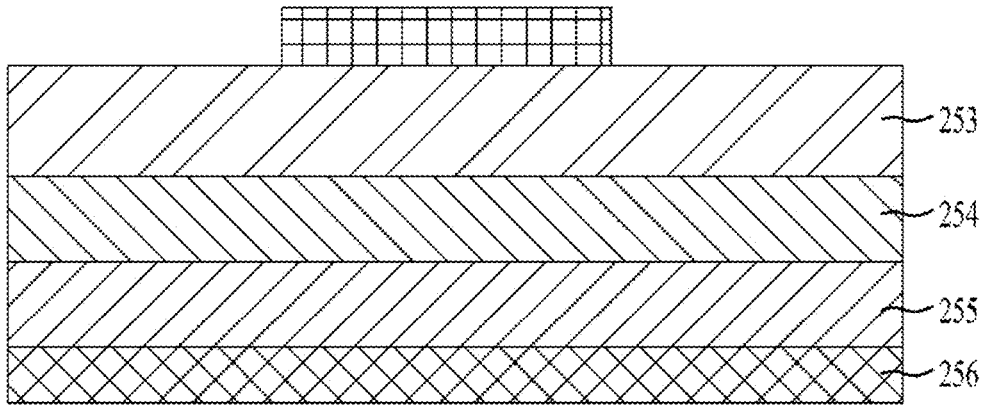
FIG. 9 is a conceptual diagram showing a vertical type semiconductor light emitting device shown in FIG. 8.

FIG. 7 is a perspective diagram of a display device using a semiconductor light emitting device according to another embodiment of the present disclosure, FIG. 8 is a cross-sectional diagram taken along a cutting line D-D shown in FIG. 8, and FIG. 9 is a conceptual diagram showing a vertical type semiconductor light emitting device shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting device 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting device 250 is connected by applying heat and pressure thereto, the semiconductor light emitting device 250 is electrically connected to the first electrode 220. In doing so, the semiconductor light emitting device 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting device 250 and the first electrode 220 as well as mechanical connection.

Thus, the semiconductor light emitting device 250 is located on the conductive adhesive layer 230, via which an individual pixel is configured in the display device. As the semiconductor light emitting device 250 has excellent luminance, an individual unit pixel may be configured in small size as well. Regarding a size of the individual semiconductor light emitting device 250, a length of one side may be equal to or smaller than 80 μm for example and the individual semiconductor light emitting device 250 may include a rectangular or square device. For example, the rectangular device may have a size equal to or smaller than 20 μm×80 μm.

The semiconductor light emitting device 250 may have a vertical structure.

Among the vertical type semiconductor light emitting devices, a plurality of second electrodes 240 respectively and electrically connected to the vertical type semiconductor light emitting devices 250 are located in a manner of being disposed in a direction crossing with a length direction of the first electrode 220.

Referring to FIG. 9, the vertical type semiconductor light emitting device 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting device 250 can dispose the electrodes at top and bottom, it is considerably advantageous in reducing a chip size.

Referring to FIG. 8 again, a phosphor layer 280 may formed on one side of the semiconductor light emitting device 250. For example, the semiconductor light emitting device 250 may include a blue semiconductor light emitting device 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting device. At a location of configuring a green unit pixel, the green phosphor 282 capable of converting blue light into green (G) light may be stacked on the blue semiconductor light emitting device. Moreover, the blue semiconductor light emitting device may be singly usable for a portion that configures a blue unit pixel. In this case, the unit pixels of red (R), green (G) and blue (B) may configure a single pixel.

Yet, the present disclosure is non-limited by the above description. In a display device to which a light emitting device of a flip chip type is applied, as described above, a different structure for implementing blue, red and green may be applicable.

Regarding the present embodiment again, the second electrode 240 is located between the semiconductor light emitting devices 250 and connected to the semiconductor light emitting devices electrically. For example, the semiconductor light emitting devices 250 are disposed in a plurality of columns, and the second electrode 240 may be located between the columns of the semiconductor light emitting devices 250.

Since a distance between the semiconductor light emitting devices 250 configuring the individual pixel is sufficiently long, the second electrode 240 may be located between the semiconductor light emitting devices 250.

The second electrode 240 may be formed as an electrode of a bar type that is long in one direction and disposed in a direction vertical to the first electrode.

In addition, the second electrode 240 and the semiconductor light emitting device 250 may be electrically connected to each other by a connecting electrode protruding from the second electrode 240. Particularly, the connecting electrode may include a n-type electrode of the semiconductor light emitting device 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting device 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting device 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting device 250, there is a problem that ITO substance has poor adhesiveness to an n-type semiconductor layer. Therefore, according to the present disclosure, as the second electrode 240 is placed between the semiconductor light emitting devices 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting devices 250. Namely, in order to isolate the semiconductor light emitting device 250 configuring the individual pixel, the partition 290 may be disposed between the vertical type semiconductor light emitting devices 250. In this case, the partition 290 may play a role in separating the individual unit pixels from each other and be formed with the conductive adhesive layer 230 as an integral part. For example, by inserting the semiconductor light emitting device 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting devices 250, the partition 290 may be located between the vertical type semiconductor light emitting device 250 and the second electrode 240 each. Therefore, an individual unit pixel may be configured using the semiconductor light emitting device 250. Since a distance between the semiconductor light emitting devices 250 is sufficiently long, the second electrode 240 can be placed between the semiconductor light emitting devices 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
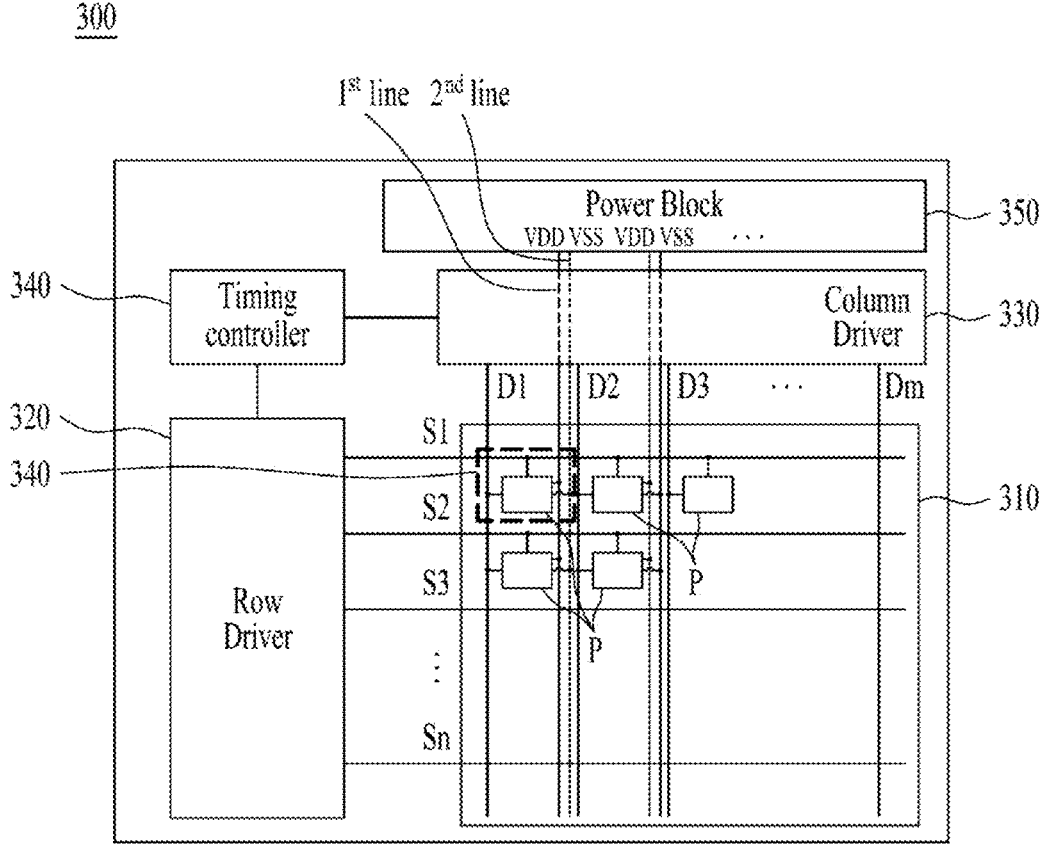
FIG. 10 is a structural diagram of a display device according to an embodiment.
Figure 11:
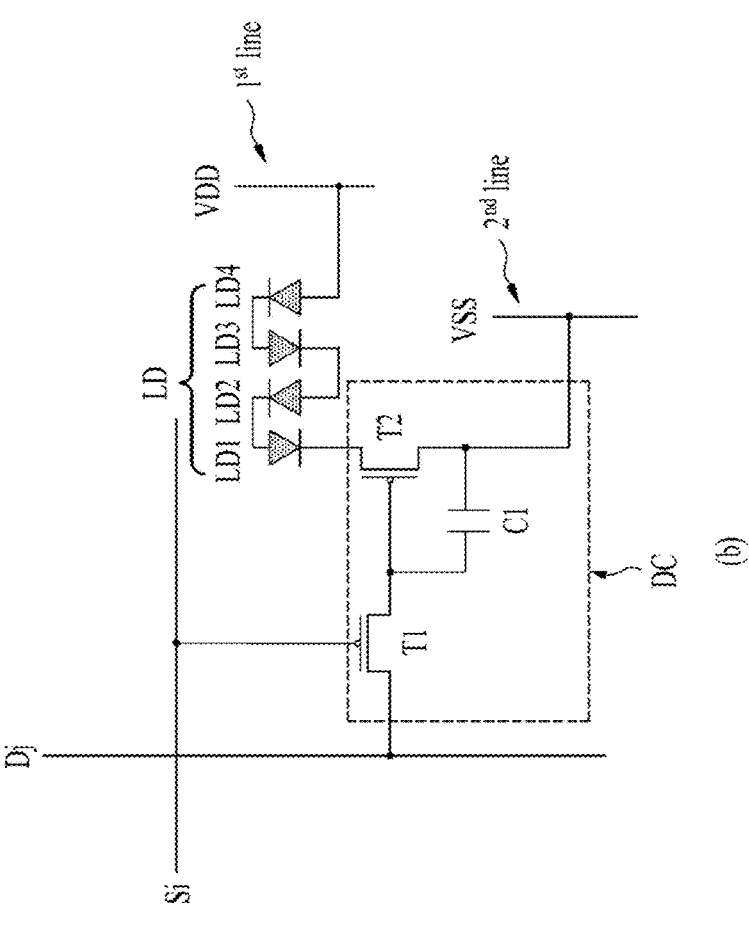
FIG. 11 is a circuit diagram of a unit light emitting area according to an embodiment.
Figure 11:
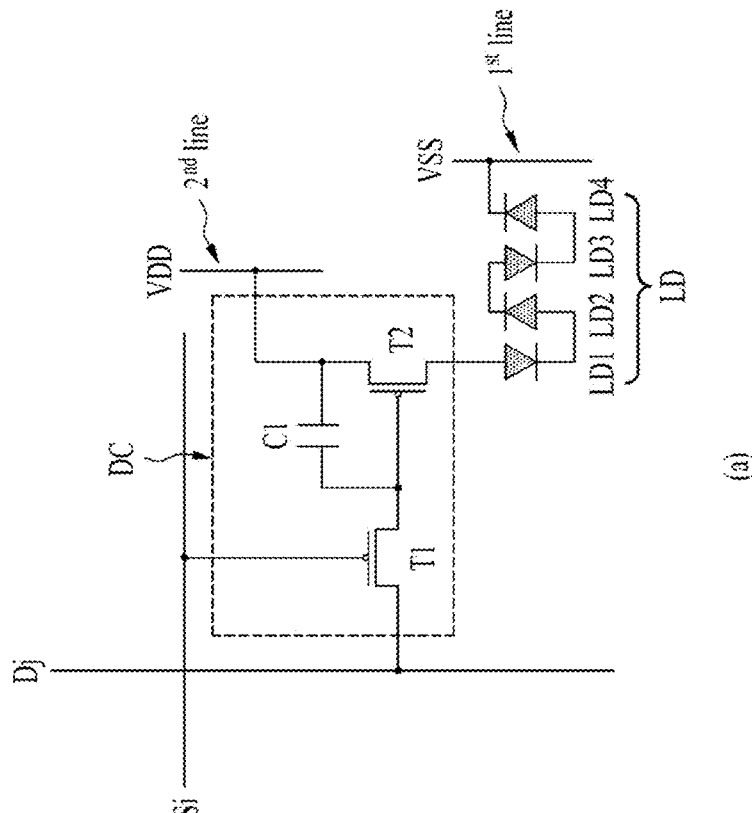

FIG. 10 is a structural diagram of a display device according to an embodiment. FIG. 11 is a circuit diagram of a unit light emitting area according to an embodiment. Specifically, the circuit diagram in FIG. 11 illustrates an area E in FIG. 10 in an enlarged manner.

A display device 300 according to one embodiment may be the display device 300 using a semiconductor light emitting device LD. In addition, the display device 300 may be a device that outputs an image via active matrix (AM) driving or a flat lighting device (a back light unit, BLU) capable of local dimming via the AM driving.

The display device 300 according to one embodiment may include an image output panel 310 for outputting the image and a controller for providing a signal to the image output panel 310. In the image output panel 310, a plurality of unit light emitting areas E are arranged along rows and columns, so that each light emitting area E may emit light independently. The controller for providing the signal to the image output panel 310 may include a row driver 320, a column driver 330, a timing controller 340, and a power supply 350.

The unit light emitting area E may include at least one semiconductor light emitting device LD and a driving circuit DC for driving the semiconductor light emitting device LD. The driving circuit DC is basically a 2T1C driving circuit for the AM driving, and is able to be serially connected to one end of the semiconductor light emitting device LD.

The semiconductor light emitting device LD may be a mini LED or a micro LED. In this regard, the mini LED may be an LED having a size of hundreds of microns, and the micro LED may be an LED having a size of several to several tens of microns. The mini LED may be an LED with a growing substrate, and the micro LED may be an LED from which the growing substrate is removed.

The driving circuit DC may be divided into a switching unit and a driver.

The switching unit may include a first transistor (switch TFT) T1 for driving the semiconductor light emitting device LD ON or OFF. A scan line Si may be connected to a gate terminal of the first transistor T1 to receive a scan signal via the row driver 320. In addition, a data line Dj may be connected to a drain terminal of the first transistor T1, and a source terminal of the first transistor T1 may be connected to a gate terminal of a second transistor (driving TFT) T2 included in the driver. Depending on a type of the first transistor T1, the components respectively connected to the drain terminal and the source terminal may be reversed.

The driver may include the second transistor T2 and a first capacitor C1. The driver may be serially connected to the semiconductor light emitting device LD. Specifically, the semiconductor light emitting device LD may be connected to a drain or source terminal of the second transistor T2. The first capacitor C1 may be connected to a gate terminal of the second transistor T2 and the drain or source terminal of the second transistor T2 to which the semiconductor light emitting device LD is not connected. Specifically, (a) in FIG. 11 shows an embodiment in which the semiconductor light emitting device LD is connected to the source terminal of the second transistor T2 and the first capacitor C1 is connected to and located between the gate terminal and the drain terminal of the second transistor T2. (b) in FIG. 11 shows an embodiment in which a semiconductor light emitting device LE is connected to the drain terminal of the second transistor T2 and the first capacitor C1 is connected to and located between the gate terminal and the source terminal of the second transistor T2.

A first fixed voltage and a second fixed voltage applied from the power supply 350 may be applied to the driver and the other end of the semiconductor light emitting device LD. The first fixed voltage may be applied to the other end of the semiconductor light emitting device LD, and the second fixed voltage may be applied to the drain or source terminal of the second transistor T2 to which the semiconductor light emitting device LD is not connected. In this regard, the first fixed voltage may be VDD, and the second fixed voltage may be VSS. In some cases, the first fixed voltage may be VSS and the second fixed voltage may be VDD. Specifically, (a) in FIG. 11 shows an embodiment in which the first fixed voltage applied to the other end of the semiconductor light emitting device LD is the VSS and the second fixed voltage applied to the drain terminal of the second transistor T2 to which the semiconductor light emitting device LD is not connected is the VDD. (b) in FIG. 11 shows an embodiment in which the first fixed voltage applied to the other end of the semiconductor light emitting device LE is the VDD and the second fixed voltage applied to the source terminal of the second transistor T2 to which the semiconductor light emitting device LD is not connected is the VSS.

The image output panel 310 may include the plurality of unit light emitting areas E along the rows and the columns, and the row driver 320 may sequentially provide the scan signals to scan lines S1 to Sn respectively disposed on the rows. Specifically, the scan signals may be sequentially provided to the scan lines S1 to Sn during one frame. The column driver 330 may provide data signals to column lines D1 to Dm respectively disposed on the columns. Specifically, the data signals may be simultaneously provided to the column lines D1 to Dm during the one frame.

The timing controller 340 may receive input image data Data and an input control signal for controlling display of the input image data from an external graphic controller (not shown). The input control signals may include, for example, a horizontal synchronization signal Hsync, a vertical synchronization signal Vsync, and a main clock MCLK. The timing controller 340 may transmit the input image data Data to the column driver 330, generate a scan control signal CONT1 and a data control signal CONT2 and transmit the signals to the row driver 320 and the column driver 330, respectively. The scan control signal CONT1 may include a scan start signal SSP instructing to start a scan and at least one clock signal SCLK, and the data control signal CONT2 may include a horizontal synchronization start signal STH instructing transmission of the input image data for pixels P in one row and at least one clock signal DCLK.

The power supply 350 may apply the first fixed voltage and the second fixed voltage to the unit light emitting area E. The power supply 350 may apply the first fixed voltage and the second fixed voltage to each unit light emitting area E. However, in this case, the circuit may become complicated. To prevent such problem, the power supply 350 may apply the first fixed voltage and the second fixed voltage to the unit light emitting area E for each column or row. Specifically, the power supply 350 may include power supply lines $1^{st}$ line and $2^{nd}$ line for providing the first fixed voltage and the second fixed voltage for each column. The first power supply line $1^{st}$ line may be connected to the other end of the semiconductor light emitting device LD to apply the first fixed voltage thereto. The second power supply line $2^{nd}$ line may be connected to the second transistor T2 to apply the second fixed voltage thereto. In some cases, the power supply 350 may provide the first fixed voltage and the second fixed voltage for each row. The first fixed voltage and the second fixed voltage applied from the power supply 350 may form a potential difference across the semiconductor light emitting device LD in response to the scan signal and the data signal.

A pixel structure constructed in the unit light emitting area E may have the circuit diagram in FIG. 11 and may be formed in various ways. Hereinafter, an embodiment of the pixel structure having the circuit diagram in FIG. 11 and constructed in the unit light emitting area E will be described.

Figure 12:
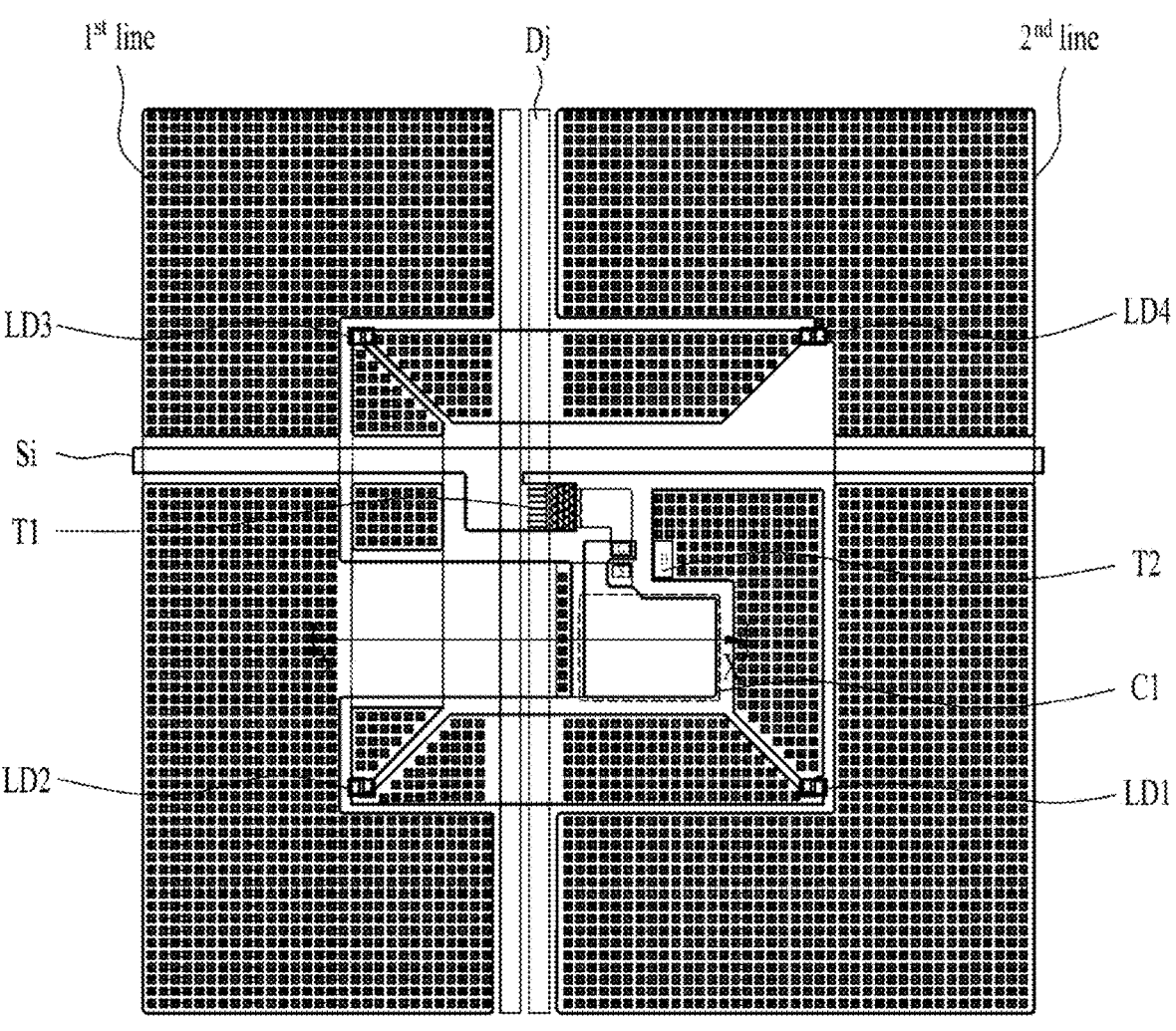
FIG. 12 is a plan view of a pixel structure having a circuit diagram in FIG. 11.
Figure 13:
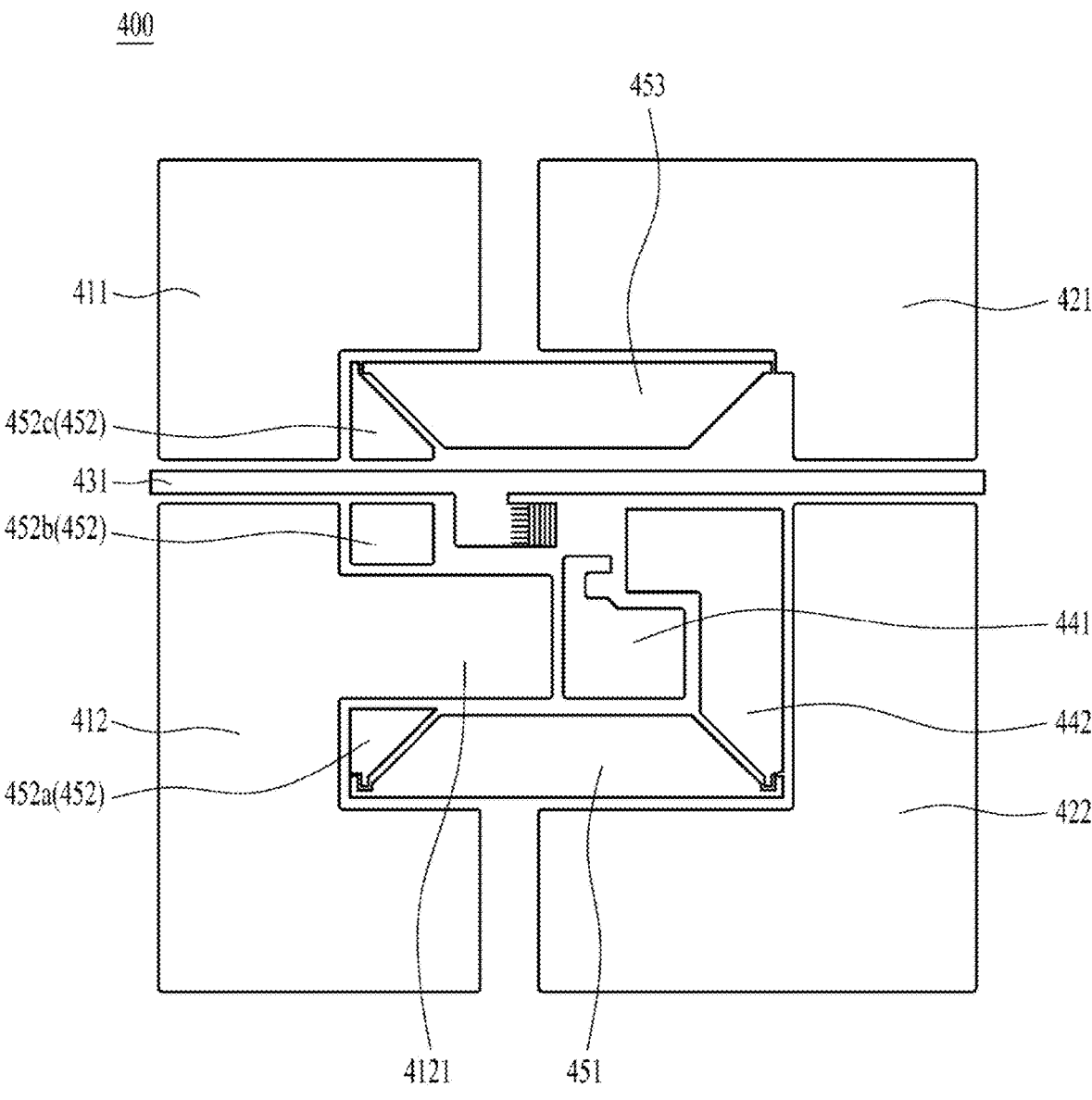
FIG. 13 is a plan view of a first layer in FIG. 12.
Figure 14:
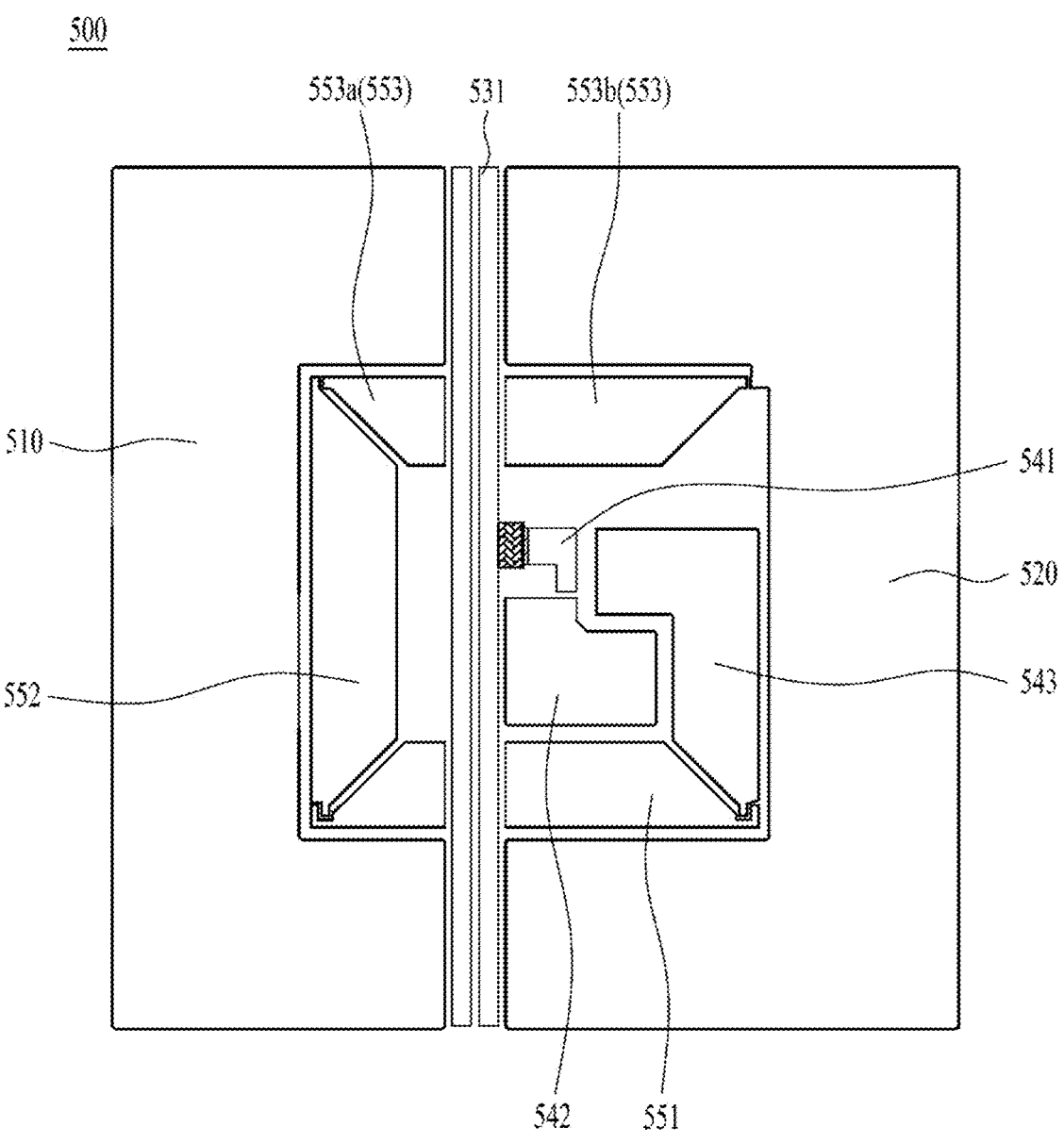
FIG. 14 is a plan view of a second layer in FIG. 12.
Figure 15:
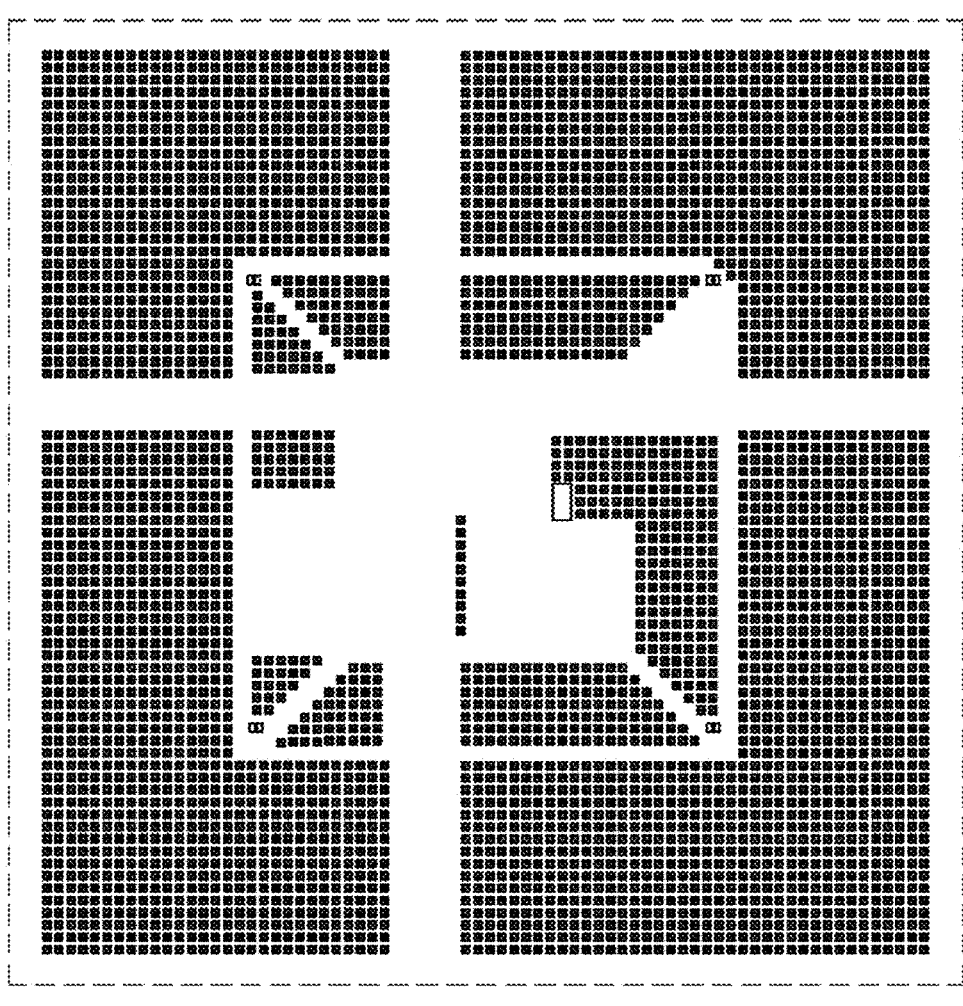
FIG. 15 shows a via hole for connecting a first layer and a second layer to each other.
Figure 16:
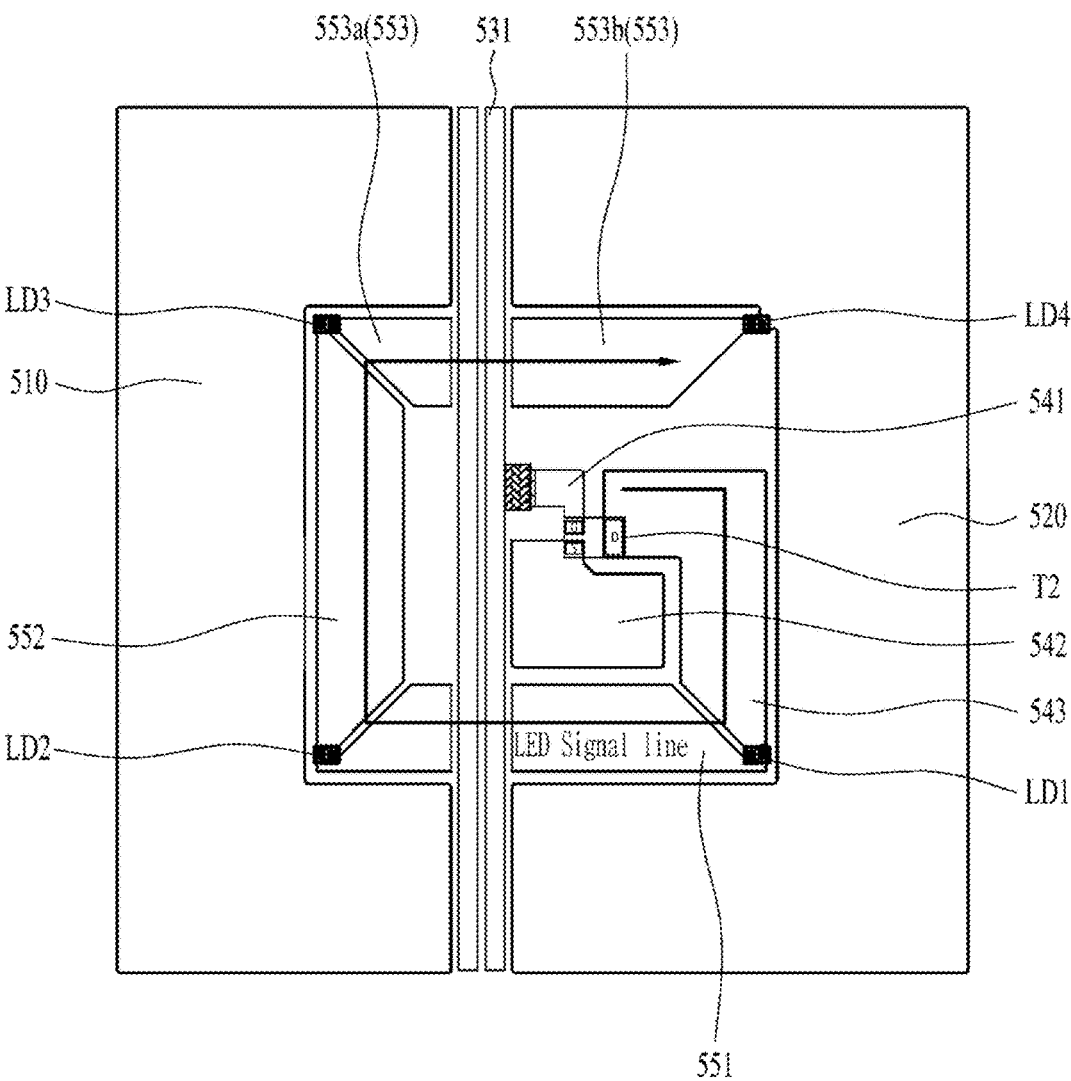
FIG. 16 is a view for illustrating a connection relationship between a second layer, a driving TFT, and a semiconductor light emitting device.
Figure 17:
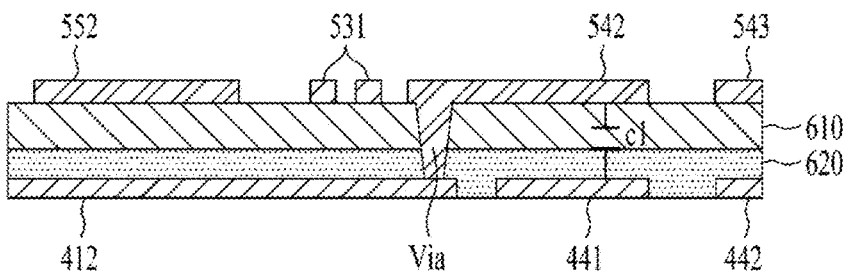
FIG. 17 is a cross-sectional view taken along a line X-X' in FIG. 12.

FIGS. 12 to 17 are views for illustrating an embodiment of the pixel structure constructed in the unit light emitting area E. Specifically, FIG. 12 is a plan view of a pixel structure having a circuit diagram in FIG. 11. FIG. 13 is a plan view of a first layer in FIG. 12. FIG. 14 is a plan view of a second layer in FIG. 12. FIG. 15 shows a via hole for connecting a first layer and a second layer to each other. FIG. 16 is a view for illustrating a connection relationship between a second layer, a driving TFT, and a semiconductor light emitting device. FIG. 17 is a cross-sectional view taken along a line X-X' in FIG. 12.

Specifically, FIGS. 12 to 17 illustrate a pixel structure corresponding to (b) in FIG. 11.

The pixel structure may be formed as a first layer 400 and a second layer 500 are stacked and connected to each other using a via hole. The first layer 400 and the second layer 500 may be metal layers and may form conductive wires through which electricity flows, and at least one of an insulating layer and a protective layer may be included between the first and second layers. In some cases, a plurality of insulating layers or a plurality of protective layers may be disposed. The first layer 400 may be disposed on the second layer 500, and in some cases, the second layer 400 may be disposed on the first layer 400.

Each of the first layer 400 and the second layer 500 may include a plurality of segmented metal patterns. The metal patterns of the first layer 400 and the second layer 500 may be connected to each other with a via hole to function as the conductive wires through which the electricity flows. In some cases, overlapping metal patterns with a unit potential difference may serve as a capacitor. Hereinafter, structures of the first layer 400 and the second layer 500 will be described in detail.

The VSS voltage may be applied to VSS metal patterns 411 and 412 of the first layer 400 and a VSS metal pattern 510 of the second layer 500. The VSS metal patterns 411 and 412 of the first layer 400 and the VSS metal pattern 510 of the second layer 500 may be connected to each other with a via hole.

The VDD voltage may be applied to VDD metal patterns 421 and 422 of the first layer 400 and a VDD metal pattern 520 of the second layer 500. The VDD metal patterns 421 and 422 of the first layer 400 and the VDD metal pattern 520 of the second layer 500 may be connected to each other with a via hole.

The VSS metal patterns 411 and 412 and the VDD metal patterns 421 and 422 of the first layer 400 and the VSS metal pattern 510 and the VDD metal pattern 520 of the second layer 500 may be arranged around edges of the pixel structure. The VSS metal patterns 411 and 412 and the VDD metal patterns 421 and 422 of the first layer 400, and the VSS metal pattern 510 and the VDD metal pattern 520 of the second layer 500 may be components connected to or included in the first power supply line $1^{st}$ line and the second power supply line $2^{nd}$ line.

The VSS metal patterns 411 and 412 of the first layer 400 may be segmented from each other and the VDD metal patterns 421 and 422 of the first layer 400 may be segmented from each other, and the scan metal pattern 431 through which the scan signal flows may extend between the patterns 411 and 412 and between the patterns 421 and 422.

The metal patterns 411, 412, and 510 to which the VSS voltage is applied may be spaced apart from the metal patterns 421, 422, and 520 to which the VDD voltage is applied so as to define a space therebetween, and a data metal pattern 531 through which the data signal flows may extend through the space. The data metal pattern 531 may be included in the second layer 500.

The first transistor T1, the second transistor T2, and the at least one semiconductor light emitting device LD may be included in an area surrounded by the metal patterns 411, 412, and 510 to which the VSS voltage is applied and the metal patterns 421, 422, and 520 to which the VDD voltage is applied. The metal patterns disposed in the first layer 400 and the metal patterns disposed in the second layer 500 may serve as conductive wires for electrically connecting components with each other.

The scan metal pattern 431 may be connected to the gate terminal of the first transistor T1. The data metal pattern 531 may be connected to the source terminal of the first transistor T1. The second layer 500 may include a connection metal 541 for connecting the drain terminal of the first transistor T1 and the gate terminal of the second transistor T2 to each other.

The first layer 400 may include a first metal pattern 441 connected to the gate terminal of the second transistor T2. The second layer 500 may include a second metal pattern 542 connected to the source terminal of the second transistor T2. The first metal pattern 441 and the second metal pattern 542 may not be connected to each other via a via hole. The first metal pattern 441 and the second metal pattern 542 may be formed so as to at least partially overlap each other (see FIG. 17).

Specifically, a first capacitor C1 may be formed as the first metal pattern 441 and the second metal pattern 542 extending from the area where the transistor T2 is disposed overlap each other with insulating layers 610 and 620 interposed therebetween. An area where the first metal pattern 441 and the second metal pattern 542 overlap may each other correspond to the first capacitor C1. A size of the area where the first metal pattern 441 and the second metal pattern 542 overlap each other may be related to the capacitance of the first capacitor C1. The larger the area where the first metal pattern 441 and the second metal pattern 542 overlap each other, the greater the capacitance of the first capacitor C1 may be.

The second metal pattern 542 disposed on the second layer 500 may be connected to the VSS metal pattern 412 disposed on the first layer 400 through the via hole. In this regard, the second metal pattern may correspond to a metal pattern connected to the second transistor T2. Specifically, the second metal pattern may correspond to a layer forming a capacitor. That is, a partial area 4121 of the VSS metal pattern 412 included in the first layer 400 may correspond to the second metal pattern. Specifically, the second metal pattern may include an upper second metal pattern 542 disposed on the first metal pattern 441, and a lower second metal pattern 4121 connected to the upper second metal pattern 542 via the via hole and disposed on a layer below the upper second metal pattern 542. In this regard, the upper second metal pattern 542 may correspond to the second metal pattern 542 disposed on the second layer 500. The lower second metal pattern 4121 may correspond to the portion 4121 extending inwardly of the VSS metal pattern 412 in the first layer 400. The lower second metal pattern 4121 may be disposed on the first layer 400 and disposed on the same layer as the first metal pattern 441.

The first layer 400 and the second layer 500 may respectively include drain metals 442 and 543 connected to the drain terminal of the second transistor T2. The drain metal 442 of the first layer 400 and the drain metal 543 of the second layer 543 may be connected to each other with a via hole.

A plurality of semiconductor light emitting devices LD1 to LD4 may be connected to each other in series via third metal patterns 451, 452, 453, 551, 552, and 553. Specifically, the plurality of semiconductor light emitting devices LD1 to LD4 may be composed of four semiconductor light emitting devices, and the third metal patterns may be segmented into first portions 451 and 551, second portions 452 and 552, and third portions 453 and 553. A first semiconductor light emitting device LD1 may be disposed between the drain metals 442 and 543 and the first portions 451 and 551, a second semiconductor light emitting device LD2 may be disposed between the first portions 451 and 551 and the second portions 452 and 552, a third semiconductor light emitting device may be disposed between the second portions 452 and 552 and the third portions 453 and 553, and a fourth semiconductor light emitting device LD4 may be disposed between the third portions 453 and 553 and the VDD metals 421, 422 and 520.

In this regard, the first portions 451 and 551, the second portions 452 and 452, and the third portions 453 and 553 may be arranged in a clockwise or counterclockwise direction. Specifically, the first portion 451 of the first layer 400 and the first portion 551 of the second layer 500 may be connected to each other with a via hole, and the first portion 551 of the second layer 500 may be segmented into two pieces for a data metal 531 to extend therebetween. The second portion 452 of the first layer 400 and the second portion 552 of the second layer 500 may be connected to each other with a via hole, and the second portion 452 of the first layer 400 may be segmented into three pieces 452a, 452b, and 452c for the scan metal 431 to extend between the pieces 452*b* and 452*c* and for the VSS metal 412 to extend inwardly between the pieces 452*a* and 452*b*. The VSS metal 412 extending inwardly may be connected to the second metal pattern 542 with a via hole. The third portion 453 of the first layer 400 and the third portion 553 of the second layer 500 may be connected to each other with a via hole. The third portion 553 of the second layer 500 may be segmented into two pieces 553*a* and 553*b* for the data metal 531 to extend between the pieces 553*a* and 553*b*.

Referring to FIG. 16, a signal flow will be described. When the data signal is introduced to the gate terminal of the second transistor T2 via the data metal 531, a voltage difference is generated across each of the semiconductor light emitting devices LD1 to LD4, and an LED signal line is formed from the drain terminal of the second transistor T2 to pass through the first semiconductor light emitting device and then pass through the fourth semiconductor light emitting device LD4.

The pixel structure corresponding to (a) in FIG. 11 may be included in the present disclosure within a range easily changeable by a person skilled in the art.

In forming the pixel structure for the AM driving, it may be important to secure the capacitance of the first capacitor C1. As the capacitance of the first capacitor C1 increases, a flicker phenomenon resulted from a signal leaked from the first transistor T1 may be prevented from occurring. The flicker phenomenon refers to image quality defects in which the semiconductor light emitting device LD flickers as the signal leaked from the first transistor T1 is applied to the driving TFT.

An area occupied by the first capacitor C1 may be defined limitedly by occupied areas and overlap relationships of the plurality of metal patterns respectively disposed on the first layer 400 and the second layer 500. As a size of the unit light emitting area E decreases, it may become difficult to secure the capacitance of the first capacitor C1 by expanding the area occupied by the first capacitor C1. Therefore, another embodiment including a second capacitor C2 to offset the capacitance limit of the first capacitor C1 will be described.

Figure 18:
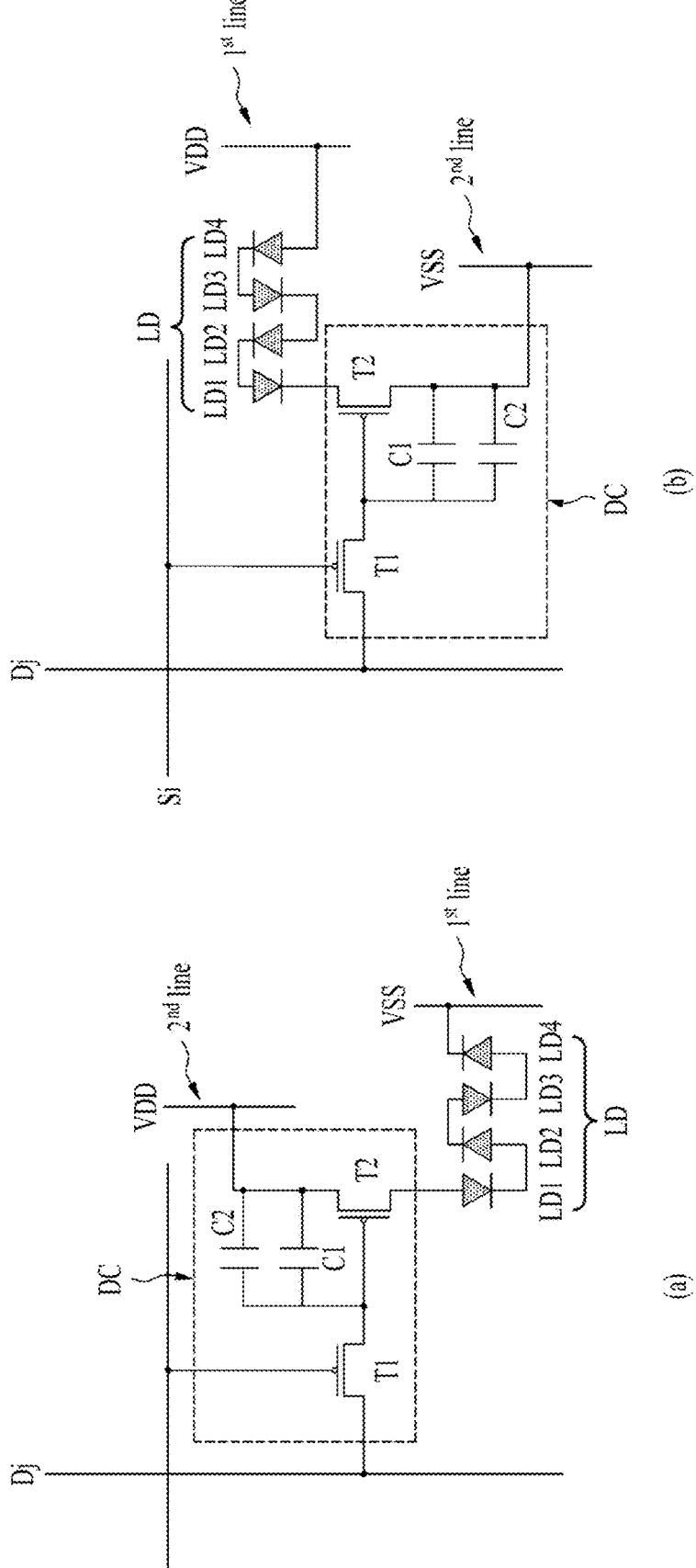
FIG. 18 is a circuit diagram of a unit light emitting area according to another embodiment.

FIG. 18 is a circuit diagram of a unit light emitting area according to another embodiment. For the same component, FIG. 11 will be referred to.

The driving circuit DC shown in FIG. 18 shows an embodiment in which the second capacitor C2 is additionally connected in parallel to the first capacitor C1. The second capacitor C2 may be connected in parallel to the first capacitor C1, and may play a role of supplementing the capacitance of the first capacitor C1. That is, a sum of the capacitance of the first capacitor C1 and a capacitance of the second capacitor C2 may correspond to a capacitance of a capacitor of the driving circuit DC.

Figure 19:
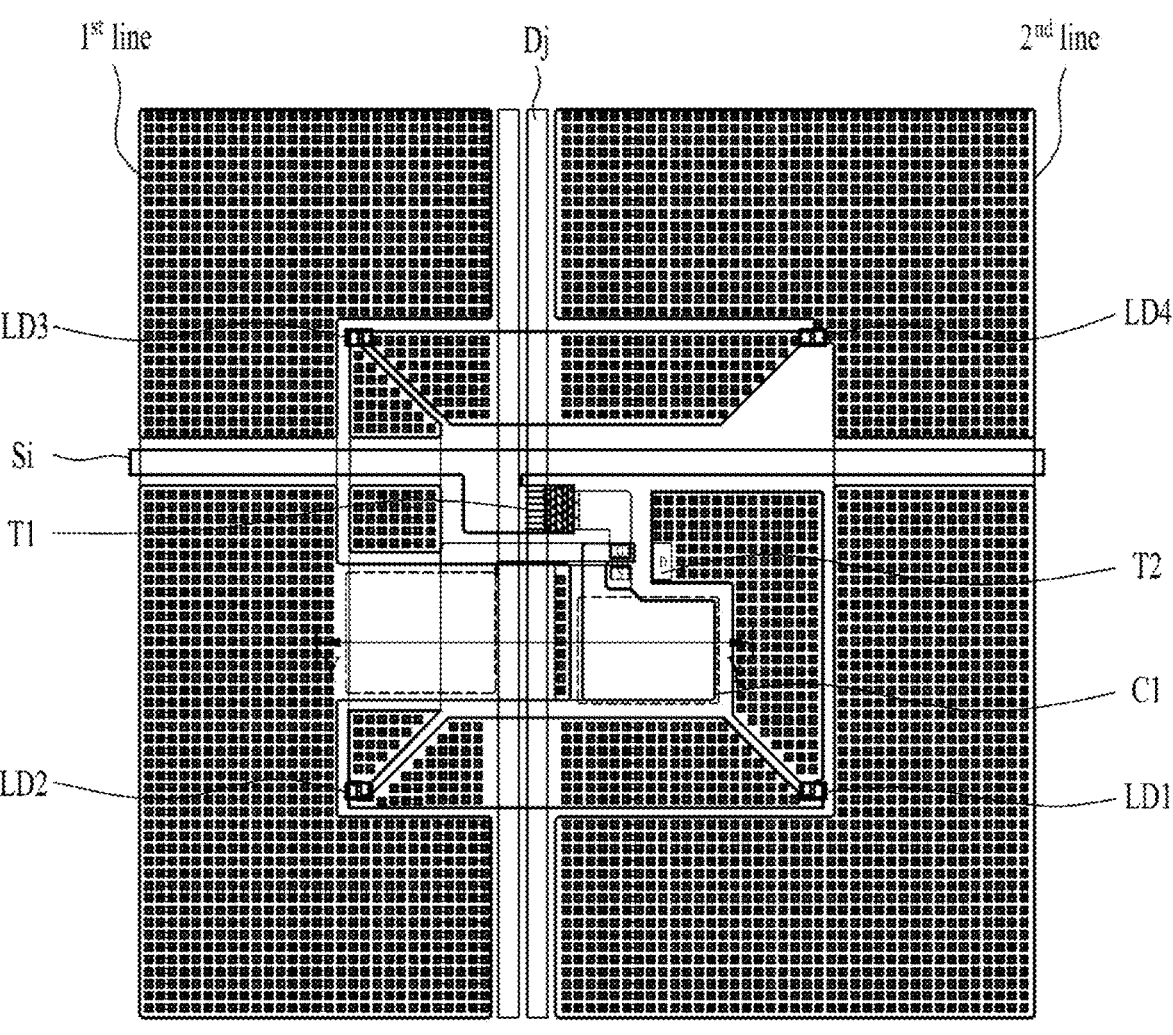
FIG. 19 is a plan view of a pixel structure having a circuit diagram in FIG. 18.
Figure 20:
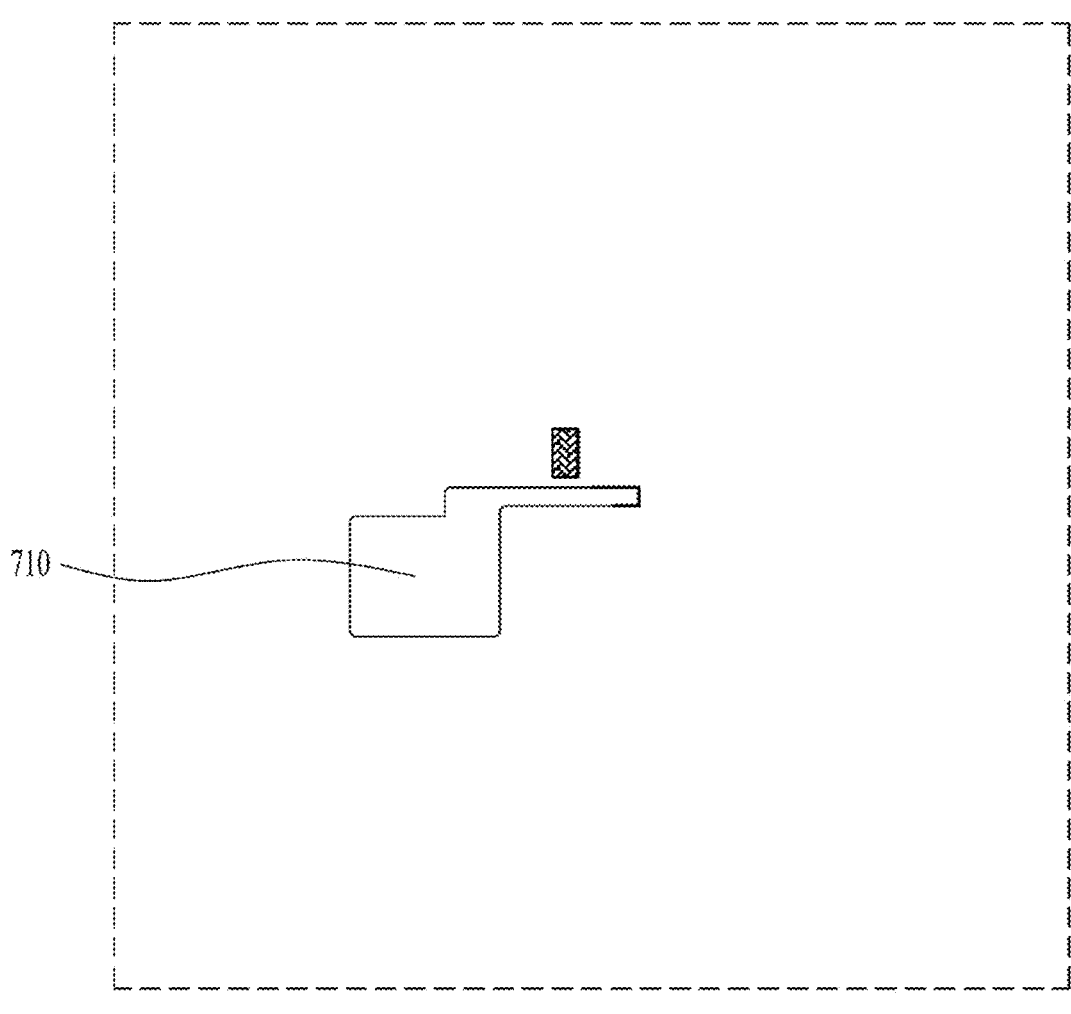
FIG. 20 is a plan view of an active layer of a driving TFT included in FIG. 19.
Figure 21:
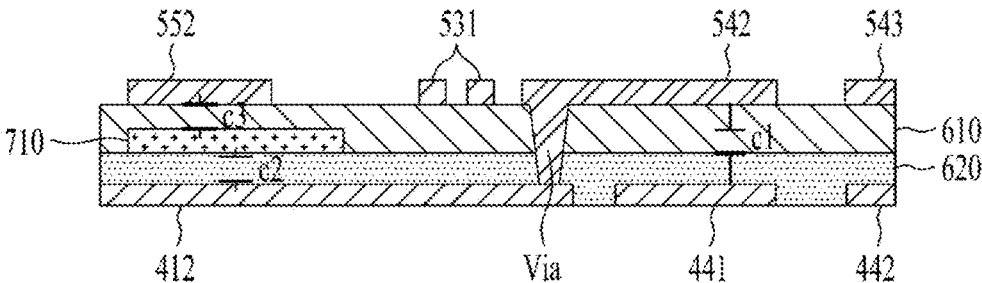
FIG. 21 is a cross-sectional view of FIG. 19 taken along a line Y-Y'.

FIG. 19 is a plan view of a pixel structure having a circuit diagram in FIG. 18. FIG. 20 is a plan view of an active layer of a driving TFT included in FIG. 19. FIG. 21 is a cross-sectional view of FIG. 19 taken along a line Y-Y'. For a description of the same component below, reference may be made to FIGS. 12 to 17. Specifically, the pixel structure in FIG. 19 differs from the pixel structure in FIG. 12 in an area of an active layer 710 in FIG. 20.

The active layer 710 in FIG. 20 may include an active layer included in first transistor T1 and an active layer included in the second transistor T2. The active layer 710, as a component that physically connects the drain and source terminals of the transistor to each other, may be a component that electrically connects the drain and source terminals to each other when a voltage is applied to the gate terminal.

Hereinafter, a description will be made by limiting the active layer 710 as a component included in the second transistor T2.

Specifically, the active layer 710 included in the second transistor T2 may extend in an area where the second transistor T2 is disposed, and the active layer 710 may overlap the second metal pattern 542 with the insulating layers 610 and 620 therebetween to form the second capacitor. Specifically, the active layer 710 may overlap the lower second metal pattern 4121 to form the second capacitor C2.

The active layer 710 may be disposed between the first layer 400 and the second layer 500. That is, the first capacitor C1 may be formed between the first layer 400 and the second layer 500, and the second capacitor C1 may be formed between the active layer 710 and the first layer 400. In this regard, the first capacitor C1 and the second capacitor C2 may be respectively formed in a first area and a second area that do not overlap each other.

In a process of designing the pixel structure, the second capacitor C2 may partially overlap the third metal 552 disposed on the second layer 500. In this case, a parasitic capacitor C3 may be formed between the third metal 552 and the active layer 710. On the circuit diagram, the parasitic capacitor C3 may be formed between a node between the second semiconductor light emitting device LD2 and the third semiconductor light emitting device LD3 and the gate terminal of the second transistor T2. The parasitic capacitor C3 may generate a luminance difference between the semiconductor light emitting devices LD1 to LD4. In addition, the parasitic capacitor C3 may reduce the capacitance of the second capacitor C2. Therefore, it may be preferable not to form such a parasitic capacitor C3. Hereinafter, a pixel structure according to another embodiment will be described.

Figure 22:
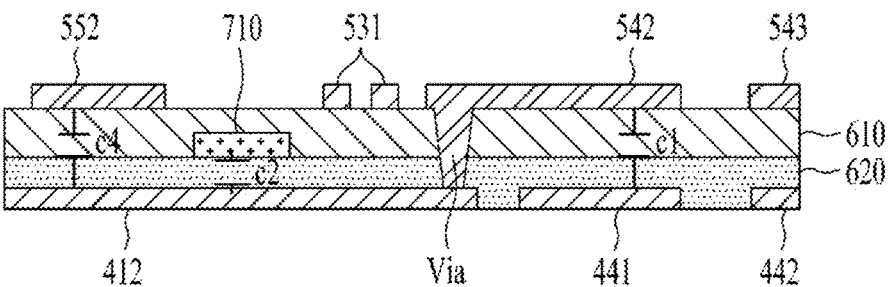
FIG. 22 is a cross-sectional view of a pixel structure according to another embodiment.

FIG. 22 is a cross-sectional view of a pixel structure according to another embodiment. Specifically, FIG. 22 is a cross-sectional view of the pixel structure corresponding to FIG. 18 viewed from a direction corresponding to that in FIG. 21.

To minimize the generation of the parasitic capacitor C3, it may be desirable that the third metal pattern 553 is disposed so as not to overlap the first capacitor C1 or the second capacitor C2 when designing the pixel structure.

First, the overlapped area may be reduced by reducing a width of the third metal pattern 553. The third metal pattern 553, as a component that connects the semiconductor light emitting devices LD to each other, may be minimized in the width in the area overlapping the second capacitor C2.

Second, the active layer 710 may be disposed so as not to overlap the third metal pattern 553. The active layer 710 may be disposed between the first layer 400 and the second layer 500 and overlap the third metal pattern 553 in an area narrower than a distance between the first layer 400 and the second layer 500. Because the capacitance of the parasitic capacitor C3 increases as the distance decreases, it may be desirable that the active layer 710 and the third metal pattern 553 are disposed so as not to overlap each other. In this regard, a parasitic capacitor C4 may also be formed between the third metal pattern 553 and the lower second metal pattern 4121. However, because the width of the third metal pattern 553 is reduced and a spacing between the pieces of the third metal pattern is widened, an influence of the parasitic capacitor C4 may be less than that of the parasitic capacitor C3 formed between the third metal 552 and the active layer 710.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

What is claimed is:

1. An active matrix (AM) driven display device using a semiconductor light emitting device, the display device comprising:
   a driving TFT for driving the semiconductor light emitting device;
   a switch TFT for receiving a scan signal so as to be turned on or off, and transmitting a data signal to a gate terminal of the driving TFT;
   a first capacitor formed between a first metal pattern connected to the gate terminal of the driving TFT and a second metal pattern connected to a source terminal or a drain terminal of the driving TFT;
   a second capacitor formed between an active layer of the driving TFT and the second metal pattern; and
   wherein the semiconductor light emitting device includes a plurality of semiconductor light emitting devices connected in series via a third metal pattern, and
   wherein the third metal pattern is disposed so as not to overlap an area where the first capacitor or the second capacitor is disposed.

2. The display device of claim 1, wherein the first capacitor is formed as the first metal pattern and the second metal pattern, extending in an area where the driving TFT is disposed, overlap each other with an insulator interposed therebetween.

3. The display device of claim 1, wherein the second capacitor is formed as the active layer and the second metal pattern, extending in an area where the driving TFT is disposed, overlap each other with an insulator interposed therebetween.

4. The display device of claim 1, wherein the first capacitor and the second capacitor are formed in a first area and a second area not overlapping each other, respectively.

5. The display device of claim 4, wherein the first capacitor and the second capacitor are connected in parallel with each other on a driving circuit connected to the semiconductor light emitting device.

6. The display device of claim 1, wherein the second metal pattern includes:
   an upper second metal pattern disposed on the first metal pattern; and
   a lower second metal pattern connected to the upper second metal pattern with a via hole and disposed on a layer below a layer of the upper second metal pattern.

7. The display device of claim 6, wherein the lower second metal pattern is disposed on a same layer as the first metal pattern.

8. The display device of claim 1, wherein the second metal pattern is connected to a power supply for providing a first fixed voltage and a second fixed voltage to be applied with the first fixed voltage.

9. The display device of claim 8, wherein the first fixed voltage and the second fixed voltage are VSS and VDD or the VDD and the VSS, respectively.

10. The display device of claim 8, wherein the semiconductor light emitting device is connected to the drain terminal of the driving TFT and applied with the second fixed voltage based on the second metal pattern being connected to the source terminal of the driving TFT,
   wherein the semiconductor light emitting device is connected to the source terminal of the driving TFT and applied with the second fixed voltage based on the second metal pattern being connected to the drain terminal of the driving TFT.

11. The display device of claim 1, wherein the third metal pattern is disposed so as not to overlap an area where the second capacitor is disposed.

12. The display device of claim 1, wherein, in the switch TFT, the scan signal is input to a gate terminal, the data signal is input to one of a source terminal and a drain terminal, and the other of the source terminal and the drain terminal is connected to the gate terminal of the driving TFT.

13. The display device of claim 1, further comprising an output area in which a plurality of unit light emitting areas are arranged,
   wherein each of the unit light emitting areas includes the semiconductor light emitting device, the switch TFT, the driving TFT, the first capacitor, and the second capacitor.

14. A display device using a semiconductor light emitting device, the display device comprising:
   a driving TFT for driving the semiconductor light emitting device;
   a switch TFT for receiving a scan signal so as to be turned on or off, and transmitting a data signal to a gate terminal of the driving TFT; and
   a first metal pattern connected to the gate terminal of the driving TFT and a second metal pattern connected to a source terminal or a drain terminal of the driving TFT, which are disposed to form a first capacitor,
   wherein an active layer of the driving TFT and the second metal pattern are disposed to form a second capacitor therebetween,
   wherein the semiconductor light emitting device includes a plurality of semiconductor light emitting devices connected in series via a third metal pattern, and
   wherein the third metal pattern is disposed so as not to overlap an area where the first capacitor the second capacitor is disposed.

15. The display device of claim 14, wherein the first metal pattern and the second metal pattern, extending in areas where the driving TFT is disposed, overlap each other with an insulator interposed therebetween.

16. The display device of claim 14, wherein the active layer and the second metal pattern, extending in areas where the driving TFT is disposed, overlap each other with an insulator interposed therebetween.

17. The display device of claim 14, wherein the second metal pattern includes:
   an upper second metal pattern disposed on the first metal pattern; and
   a lower second metal pattern connected to the upper second metal pattern with a via hole and disposed on a layer below a layer of the upper second metal pattern.

18. The display device of claim 17, wherein the lower second metal pattern is disposed on a same layer as the first metal pattern.

* * * * *